(12) United States Patent
Mukundan et al.

(10) Patent No.: US 12,181,077 B2
(45) Date of Patent: Dec. 31, 2024

(54) VIRTUAL VALVE IN A MEMS-BASED COOLING SYSTEM

(71) Applicant: Frore Systems Inc., San Jose, CA (US)

(72) Inventors: Vikram Mukundan, San Ramon, CA (US); Ananth Saran Yalamarthy, Stanford, CA (US); Prabhu Sathyamurthy, San Jose, CA (US); Suryaprakash Ganti, Los Altos, CA (US); Narayana Prasad Rayapati, Mountain View, CA (US); Seshagiri Rao Madhavapeddy, La Jolla, CA (US)

(73) Assignee: Frore Systems Inc., San Jose, CA (US)

( * ) Notice: Subject to any disclaimer, the term of this patent is extended or adjusted under 35 U.S.C. 154(b) by 1195 days.

(21) Appl. No.: 16/715,793

(22) Filed: Dec. 16, 2019

(65) Prior Publication Data

US 2021/0180723 A1 Jun. 17, 2021

(51) Int. Cl.
| | | |
|---|---|---|
| *F16K 99/00* | (2006.01) | |
| *B81B 7/00* | (2006.01) | |
| *F04B 19/00* | (2006.01) | |
| *F04B 39/10* | (2006.01) | |
| *F04B 43/00* | (2006.01) | |

(Continued)

(52) U.S. Cl.
CPC ........ *F16K 99/0048* (2013.01); *B81B 7/0061* (2013.01); *F04B 19/006* (2013.01); *F04B 39/1093* (2013.01); *F04B 43/0009* (2013.01); *F04B 43/0027* (2013.01); *F04B 53/1077* (2013.01); *H05K 7/20272* (2013.01); *B81B 2201/031* (2013.01)

(58) Field of Classification Search
CPC ........... B81B 2201/031; F04B 39/1093; F04B 43/0009; F04B 43/0027; F04B 53/1077; F04B 19/006
See application file for complete search history.

(56) References Cited

U.S. PATENT DOCUMENTS 7,841,843 B2 * 11/2010 Cho ................ H01L 23/467
417/413.1
7,972,124 B2 * 7/2011 Hirata ................ F04B 45/047
417/413.2

(Continued)

FOREIGN PATENT DOCUMENTS

EP 3364452 8/2019
JP 2019031946 2/2019

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

*Primary Examiner* — Christopher S Bobish
(74) *Attorney, Agent, or Firm* — Van Pelt, Yi & James LLP

(57) ABSTRACT

An active cooling system includes at least one cooling element that has a vent therein. The active cooling element is in communication with a fluid. The cooling element(s) are actuated to vibrate to drive the fluid toward a heat-generating structure and to alternately open and close at least one virtual valve corresponding to the vent. The virtual valve is open for a low flow resistance and closed for a high flow resistance. The vent remains physically open when the virtual valve is closed.

20 Claims, 9 Drawing Sheets

(51) Int. Cl.
*F04B 53/10* (2006.01)
*H05K 7/20* (2006.01)

(56) References Cited

U.S. PATENT DOCUMENTS

| | | | | |
|---|---|---|---|---|
| 8,051,905 | B2* | 11/2011 | Arik | H01L 23/4735 |
| | | | | 239/102.1 |
| 8,308,452 | B2* | 11/2012 | Amirouche | F04B 43/046 |
| | | | | 417/413.2 |
| 8,678,787 | B2 | 3/2014 | Hirata | |
| 8,684,707 | B2* | 4/2014 | Kanai | F04B 45/047 |
| | | | | 417/410.2 |
| 8,721,303 | B2* | 5/2014 | Fujisaki | F04B 43/095 |
| | | | | 417/413.2 |
| 8,899,944 | B2 | 12/2014 | Kanai | |
| 9,433,359 | B2* | 9/2016 | Sano | A61B 5/02233 |
| 9,506,464 | B2* | 11/2016 | Hirata | H10N 30/2047 |
| 10,871,155 | B2* | 12/2020 | Mou | F04B 45/047 |
| 11,830,789 | B2* | 11/2023 | Ganti | F04B 53/08 |
| 2007/0122299 | A1* | 5/2007 | Wen | F04B 43/14 |
| | | | | 417/413.2 |
| 2011/0259557 | A1 | 10/2011 | Chao | |
| 2015/0071797 | A1 | 3/2015 | Takeuchi | |
| 2017/0058882 | A1* | 3/2017 | Hirata | F04B 43/046 |
| 2018/0187672 | A1 | 7/2018 | Tanaka | |
| 2019/0085836 | A1 | 3/2019 | Mou | |
| 2020/0049143 | A1 | 2/2020 | Ganti | |

\* cited by examiner

VIRTUAL VALVE IN A MEMS-BASED COOLING SYSTEM

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devise, such as laptop computers or desktop computers. Passive cooling devices, such as heat spreaders, may be used in smaller computing devices, such as smartphones. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
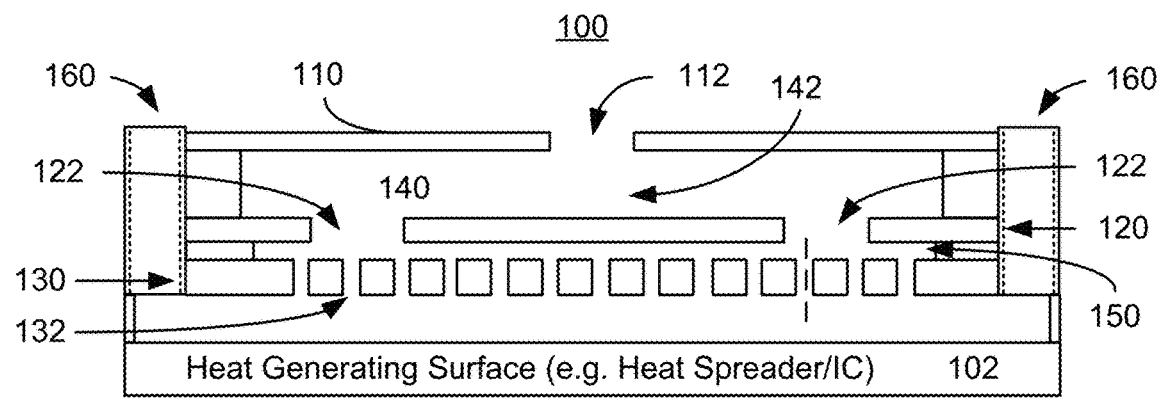
FIGS. 1A-1D are diagrams depicting an exemplary embodiment of an active cooling system usable with a structure.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablets and notebooks can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan can be energized in response to an increase in temperature of internal components. The fans drive air through the larger devices to cool internal components. However, such fans are typically too large for mobile devices such as smartphones or for thinner devices such as tablets. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile device are desired.

An active cooling system is described. The active cooling system includes at least one cooling element that has a vent therein and is in communication with a fluid. The cooling element(s) are actuated to vibrate to drive the fluid toward a heat-generating structure and to alternately open and close at least one virtual valve corresponding to the vent. The virtual valve is open for a low flow resistance and closed for a high flow resistance. The vent remains physically open for the virtual valve being closed.

In some embodiments, the at least one cooling element includes a first cooling element and a second cooling element. The first cooling element and/or the second cooling element may be a piezoelectric micro-electrical mechanical system (MEMS) cooling element. The first cooling element has a passive vent therein and is in communication with a fluid. The second cooling element is between the first cooling element and a heat-generating structure. The second cooling element has an active vent therein. The virtual valve(s) include a passive virtual valve corresponding to the passive vent and an active virtual valve corresponding to the active vent. The passive virtual valve is open in a suction arrangement and closed in an expulsion arrangement. The active virtual valve is closed in the suction arrangement and open in the expulsion arrangement. At least one of the first cooling element and the second cooling element uses vibrational motion to provide the suction arrangement and the expulsion arrangement such that the fluid is directed toward the heat-generating structure and such that the active vent and the passive vent remaining physically open throughout the vibrational motion.

The first and second cooling elements may be configured such that in the suction arrangement the passive vent has a passive suction flow resistance and the active vent has an active suction flow resistance. The first and second cooling elements may also be configured such that in the expulsion arrangement, the passive vent has a passive expulsion flow resistance and the active vent has an active expulsion flow resistance. The passive expulsion flow resistance is greater than the active expulsion flow resistance. The passive suction flow resistance is less than the active suction flow resistance. Thus, by moderating the dynamic flow resistance through the active and passive vents, virtual valves may be formed at the active and passive vents. The active and passive virtual valves may be alternately opened and closed as described above.

In some embodiments, the active cooling system includes an orifice plate having orifice(s) therein. The orifice plate is between the second cooling element and the heat-generating structure. The orifice(s) have an axis oriented at an angle from a normal to a surface of the heat-generating structure. The angle is selected from substantially zero degrees and a nonzero acute angle.

In some embodiments, the first and second cooling elements are separated by a gap. The vibrational motion is such that the gap has a first width of not more than ten micrometers in the expulsion arrangement and the gap has a second width of not less than twenty micrometers in the suction arrangement. Thus, the width of the gap may affect the flow resistance of the active and passive vents. The passive vent may be configured such that the passive expulsion flow resistance divided by the passive suction flow resistance is at least three and not more than ten. Thus, the passive virtual valve for the passive vent may be considered open in the suction arrangement and closed in the expulsion arrangement. In some embodiments, the active vent is configured such that the active suction flow resistance divided by the active expulsion flow resistance is at least three and not more than ten. Thus, the active virtual valve for the active vent may be considered to be open in the expulsion arrangement and closed in the suction arrangement. In such embodiments, the ratio of the flow resistance for the virtual valve being closed to the virtual valve being open is at least three and not more than ten. The cooling elements may be configured to direct the fluid toward the heat-generating structure at a speed of at least thirty meters per second.

The vibrational motion has a frequency of at least 15 kHz in some embodiments. The vibrational motion may be out-of-phase vibrational motion of the first cooling element and the second cooling element. Both cooling elements vibrate in some embodiments. This out-of-phase vibration, or the vibration of individual cooling element(s), may be at or near the resonance frequency of the cooling element(s). In some embodiments, an elastic device couples the first and second cooling elements. Such an elastic device may aid in maintaining out-of-phase vibration at or near resonance. In some embodiments, the first cooling element has a landing adjacent to the passive vent and the second cooling element includes a plug opposite to the landing of the first cooling element. In some embodiments, the plug includes a plug surface facing the passive vent. The plug surface and/or a landing surface of the landing forms tortuous path for the fluid. In some embodiments, the cooling system includes a return path for the fluid to a side of the first cooling element distal from the heat-generating structure.

Using the active cooling system, fluid may be drawn in through the passive vent (in the suction arrangement/passive virtual valve open) and driven through the active vent and orifices in the orifice plate (in the expulsion arrangement/ active virtual valve open). Because of the vibrational motion, fluid is driven toward the heat-generating structure, may deflect off of the heat-generating structure and travels along the channel between the heat-generating structure and orifice plate. Thus, the fluid may efficiently dissipate heat from the heat-generating structure. Because fluid impinges upon the heat-generating structure with sufficient speed and in some embodiments substantially normal to the heat-generating structure, the boundary layer of fluid at the heat-generating structure may be thinned and/or partially removed. Consequently, heat transfer between the heat-generating structure and the moving fluid is improved. Because the heat-generating structure is more efficiently cooled, the corresponding integrated circuit may be run at higher speed and/or power for longer times. Thus, performance of a device utilizing the active cooling system may be improved. Further, the active cooling system may be a MEMS device. Consequently, the active cooling systems are suitable for use in thinner devices such as mobile devices (e.g. smartphones, virtual reality devices and tablets). Performance of mobile devices may thus be improved. The active cooling system may also be used in other compute devices-both mobile (such as those discussed above and laptop computers) and non-mobile (such as desktop computers or smart televisions). Because the first and second cooling element(s) may be vibrated at frequencies of 15 kHz or more, users may not hear any noise associated with actuation of cooling elements. If driven at or near resonance frequency for the first and second piezoelectric cooling element(s), the power used in operating cooling systems may be significantly reduced.

Further, the active and passive vents remain physically open throughout vibration. Instead of physically closing vents, the virtual valves corresponding to the vents are opened and closed. This is accomplished by providing sufficient differences in the flow resistance (or pressure) between the suction and expulsion arrangements, as described above. In lieu of physically closing, a passive virtual valve for the passive vent may be closed while an active virtual valve for the active vent is open and vice versa. Because vents in cooling element(s) need not be physically closed, resonance of the cooling element(s) may be more readily maintained. The benefits of improved, quiet cooling may be achieved with limited additional power. Consequently, performance of devices incorporating the active cooling system may be improved.

Figure 1B:
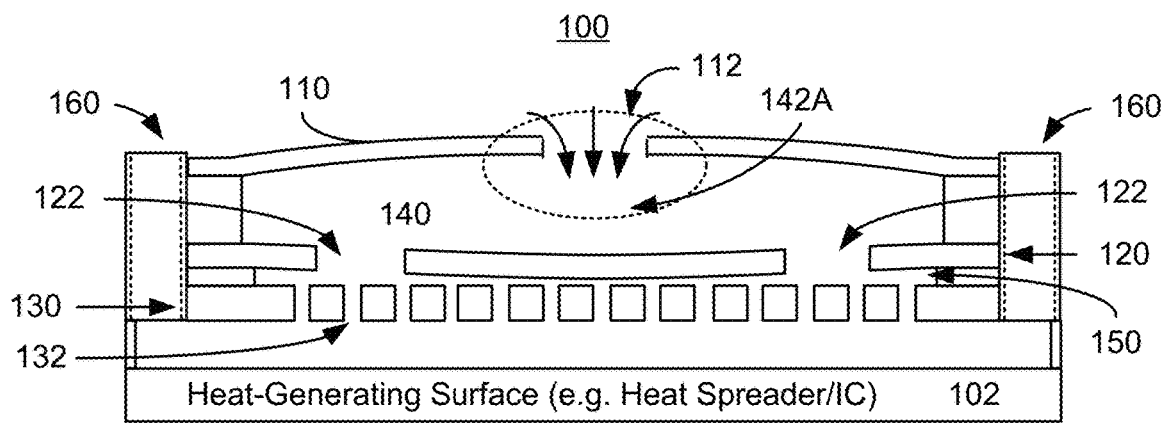
Figure 1C:
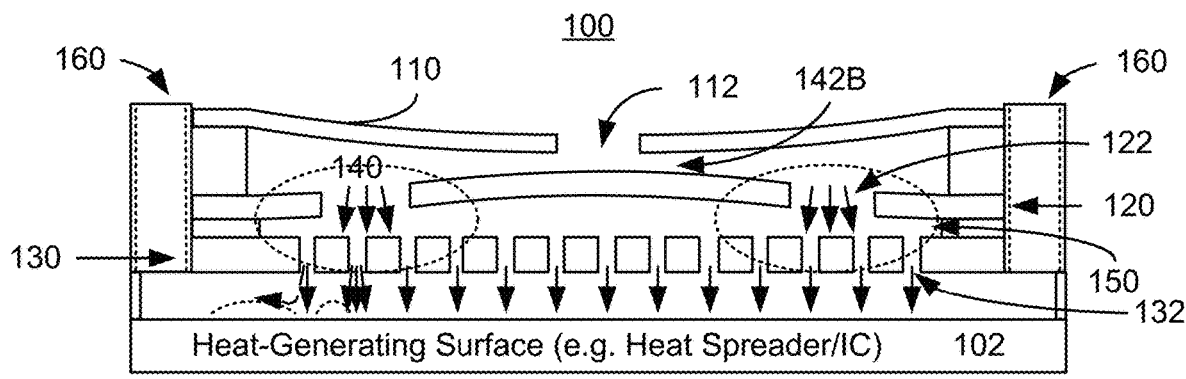
Figure 1D:
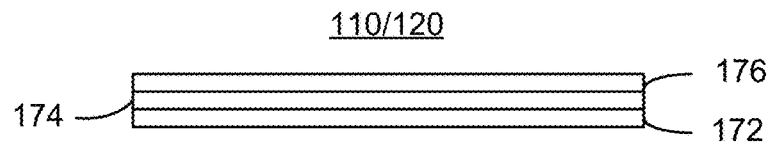

FIGS. 1A-1D are diagrams depicting an exemplary embodiment of active cooling system 100 usable with a heat-generating structure 102. For clarity, only certain components are shown and FIGS. 1A-1D are not to scale. FIGS. 1A-1C depict operation of cooling system 100, while FIG. 1D depicts piezoelectric cooling element 110/120. Referring to FIGS. 1A-1C, the cooling system 100 is used in connection with a heat-generating structure 102. Although shown as symmetric, cooling system 100 need not be symmetric.

Heat-generating structure 102 generates or conducts heat from a nearby heat-generating object during operation and is desired to be cooled. Heat-generating structure 102 may include semiconductor components(s) including individual integrated circuit components such as processors, other integrated circuit(s) and/or chip package(s); sensor(s); optical device(s); one or more batteries; or other component(s) of an electronic device such as a computing device; heat spreaders; heat pipes; other electronic component(s) and/or other device(s) desired to be cooled. The devices may also have limited space in which to place a cooling system. For example, cooling system 100 may be used in computing devices. Such computing devices may include but are not limited to smartphones, tablet computers, laptop computers, two-in-one laptops, hand held gaming systems, digital cameras, virtual reality headsets, augmented reality headsets, mixed reality headsets and other devices. Cooling system 100 may be a micro-electro-mechanical system (MEMS) cooling system capable of residing within mobile computing devices. For example, the total height of cooling system 100 (from the top of heat-generating structure 102 to the top of system 100/cooling element 110) may be less than one millimeter and in some embodiments does not exceed two hundred and fifty micrometers. Although one cooling system 100 is shown (e.g. one cooling cell), multiple cooling systems might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. Cooling system 100 includes a first cooling element 110 that is in contact with a fluid and a second cooling element 120. In some embodiments, cooling system 100 also includes orifice plate 130 and optional chimneys 160. The fluid used to cool heat-generating structure 102 starts at the side of cooling element 110 distal from heat-generating structure 102.

Cooling element 110 has a first side distal from heat-generating structure 102 and a second side proximate to heat-generating structure 102. In the embodiment shown in FIGS. 1A-1C, the first side of cooling element 110 is the top of cooling element 110 and the second side is the bottom of cooling element 110. Cooling element 110 also has a passive vent 112 therein. In the embodiment shown, passive vent 112 is a centrally located aperture in cooling element 110. In other embodiments, passive vent 112 may be located elsewhere. For example, passive vent 112 may be closer to one of the edges of cooling element 110. Passive vent 112 may have a circular, rectangular or other shaped footprint. Although one passive vent 112 is shown, multiple passive vents might be used. Passive vent 112 does not come in proximity to another structure in cooling system 100 during motion. In other embodiments, a top vent may simply be termed the passive vent.

Cooling element 120 is between cooling element 110 and heat-generating structure 102. In the embodiment shown, cooling element 120 is also between cooling element 110 and orifice plate 130. Cooling elements 110 and 120 are separated by gap 142 and form a top chamber 140. A bottom chamber 150 is formed between cooling element 120 and orifice plate 130. Cooling element 120 also has active vents 122 therein. Active vents 122 come in proximity to another structure in cooling system 100 during motion. In other embodiments, a bottom vent may simply be termed the active vent. In the embodiment shown, active vents 122 are apertures located away from the central region of cooling element 120. In other embodiments, active vents 122 may be located elsewhere. For example, an active vent may be centrally located in cooling element 120. Although two active vents 122 are shown, another number (e.g. one, three, etc.) might be present. In some embodiments, active vents 122 are positioned such that the active vents 122 are not aligned with passive vent 112. Active vents 122 may have circular, rectangular or other shaped footprints.

Cooling elements 110 and/or 120 may be a piezoelectric cooling element. An embodiment of piezoelectric cooling element 110 and/or 120 is shown in FIG. 1D. Consequently, cooling element(s) 110 and/or 120 and analogous cooling elements are referred to hereinafter as piezoelectric cooling element though it is possible that a mechanism other than a piezoelectric might be used to drive the cooling element. In some embodiments, cooling element(s) 110 and/or 120 includes a piezoelectric layer 174 on a stainless steel and/or Hastelloy substrate 172. In some embodiments, piezoelectric layer 174 includes multiple sublayers. For example, piezoelectric layer 174 may be a multilayer piezoelectric. Piezoelectric cooling element(s) 110 and/or 120 may also include a top electrode 176. In some embodiments, a bottom electrode may be formed by stainless steel substrate 172. In other embodiments, a bottom electrode (not shown) may be provided between substrate 172 and piezoelectric 174. Other layers (not shown) including but not limited to seed, capping, passivation or other layers might be included in piezoelectric cooling element(s) 110 and/or 120. In some embodiments, cooling element(s) 110 and/or 120 have a thickness of not more than two hundred micrometers. In some such embodiments, the thickness(es) of cooling element(s) 110 and/or 120 is not more than one hundred micrometers (e.g. may be nominally one hundred nanometers). In some embodiments, the width and/or length (or radius) of piezoelectric cooling element(s) 110 and/or 120 are at least three millimeters. In some embodiments, the width and/or length is at least five millimeters. In some such embodiments, the width and/or length is at least seven millimeters.

Orifice plate 130 has orifices 132 therein. Although shown as distributed throughout orifice plate 130, orifices may be positioned in another manner. A single orifice plate 130 is used for a single cooling system 100. In other embodiments, multiple cooling systems 100 may share an orifice plate. Orifices 132 are shown as having an axis oriented normal to a surface of heat-generating structure 102. This axis is indicated by the dashed line through one orifice in FIG. 1A. In other embodiments, the axis of one or more orifices 132 may be at another angle. For example, the angle of the axis may be selected from substantially zero degrees and a nonzero acute angle.

In some embodiments, cooling system 100 includes chimneys 160. Chimneys 160 provide a return path for heated fluid to flow away from heat-generating structure 102. In some embodiments, chimneys 160 return fluid to the side of cooling element 110 distal from heat-generating structure 102. In the embodiment shown, chimneys 160 direct heated fluid substantially perpendicular to heat-generating structure 102 and toward the side of cooling element 110 distal from heat-generating structure 102. In other embodiments, chimneys 160 may be omitted or configured in another manner. For example, chimneys may instead direct fluid away from heat-generating structure 102 in a direction parallel to heat-generating structure 102 or perpendicular to heat-generating structure 102 but opposite to the direction shown (e.g. toward the bottom of the page). If multiple cooling systems 100 are provided in an array, each cooling system 100 may include chimneys, only cooling systems 100 at the edges may include chimneys, other ducting may be provided at the edges or other locations in the array to provide a path for heated fluid to flow and/or other mechanisms may be used to allow heated fluid to be removed from the region proximate to heat-generating structure 102.

As discussed above, cooling system 100 may be a MEMS device. Thus, the dimensions of cooling system 100 may be small. For example, cooling system 100 may have a rectangular footprint with sides having a length of not more than seven millimeters. In some such embodiments, the length may be at least three millimeters. In some embodiments, cooling system 100 is square. Orifice plate 130 may be located a distance from heat-generating structure 102 that is at least fifty micrometers and not more than five hundred micrometers. In some embodiments, this distance is not more than two hundred micrometers. In some embodiments, this distance between orifice plate 130 and heat-generating structure 102 is at least one hundred micrometers. Orifice plate 130 may have a thickness of at least ten and not more than twenty-five micrometers in some embodiments. The depth of cooling system 100 may be at least forty micrometers and not more than five hundred micrometers. In some embodiments, this depth is at least fifty micrometers and not more than three hundred micrometers. Thus, piezoelectric cooling elements 110 and/or 120 may be at least forty and not more than five hundred micrometers from orifice plate 130. Piezoelectric cooling elements 110 and/or 120 may be at least fifty and not more than five hundred micrometers from heat-generating structure 102. In some embodiments, orifice plate 130 is at least fifty and not more than one hundred fifty micrometers thick. For example, orifice plate 130 may be nominally one hundred micrometers thick. In some embodiments, the entire thickness of cooling system 100 is not more than five hundred micrometers. In some embodiments, the entire thickness of cooling system 100 is at least two hundred fifty micrometers. In some embodiments, the diameters of orifices 132 are at least fifty micrometers and not more than two hundred micrometers. In some embodiments, orifices 132 occupy at least two percent and not more than five percent of the portion of the orifice plate 130 below cooling element 120. In other embodiments, other dimensions may be used.

FIG. 1A depicts cooling system 100 in a neutral position. Thus, cooling elements 110 and 120 are shown as substantially flat. In operation, piezoelectric cooling elements 110 and 120 are actuated to vibrate between positions shown in FIGS. 1B and 1C. Piezoelectric cooling elements 110 and 120 are, therefore, piezoelectric actuators. Operation of cooling system 100 is described in the context of FIGS. 1B and 1C. Referring to FIG. 1B, piezoelectric cooling element 110 has been actuated to move away from (deform to be convex) heat-generating structure 102, while piezoelectric cooling element 120 has been actuated to move toward (deform to be concave) heat-generating structure 102. This configuration is referred to as the suction arrangement. Because of the vibrational motion of piezoelectric cooling elements 110 and 120, gap 142 has increased in size and is shown as gap 142A. For example, in some embodiments, gap 142 has a height of at least ten and not more than twenty micrometers in the neutral position (FIG. 1A). Gap 142A may have a height of at least twenty and not more than thirty micrometers in the suction arrangement (FIG. 1B). Thus, top chamber 140 has increased in volume, while bottom chamber 150 has decreased in volume. In the suction arrangement, the flow resistance of passive vent 112 (passive suction flow resistance) is low. Consequently, the pressure at passive vent 112 is low. In contrast, the flow resistance of active vent 122 (active suction flow resistance) is high. Consequently, the pressure at active vent 122 is high. Because of the low passive suction flow resistance, fluid is drawn into top chamber 140 through passive vent 112. This is shown by arrows in FIG. 1B. However, fluid does not flow out of (or flows out to a limited extent) active vent 122 because of the high passive suction flow resistance. However, active vent 122 is not physically closed in this configuration. For example, active vent 122 is not in contact with orifice plate 130 in the suction arrangement.

FIG. 1C depicts an expulsion arrangement. Piezoelectric cooling element 110 has been actuated to move toward (deform to be concave) heat-generating structure 102, while piezoelectric cooling element 120 has been actuated to move away from (deform to be convex) heat-generating structure 102. Because of the vibrational motion of piezoelectric cooling elements 110 and 120, gap 142 has decreased in size and is shown as gap 142B. For example, in some embodiments, gap 142 has a height of at least ten and not more than twenty micrometers in the neutral position (FIG. 1A). Gap 142B has a height of at least five and not more than ten micrometers in the expulsion arrangement (FIG. 1C). Thus, top chamber 140 has decreased in volume, while bottom chamber 150 has increased in volume. In the expulsion arrangement, the flow resistance of passive vent 112 (passive expulsion flow resistance) is high. Consequently, the pressure at passive vent 112 is high. In contrast, the flow resistance of active vent 122 (active expulsion flow resistance) is low. Consequently, the pressure at active vent 122 is low. Because of the low active expulsion flow resistance, fluid is expelled from top chamber 140 through active vent 122, into bottom chamber 150 and through orifices 132. This is shown by arrows in FIG. 1C. However, fluid does not flow out of (or flows out to a limited extent) passive vent 112 because of the high passive expulsion flow resistance. Thus, passive vent 112 is considered closed and active vent 122 is considered open in the expulsion arrangement. However passive vent 112 is not physically closed in this configuration. For example, passive vent 112 is not in contact with cooling element 120 in the expulsion arrangement. Gap 142B does not have a zero length.

Virtual valves may be considered to be formed at or near active vent 122 and passive vent 112. The regions of the open virtual valves are shown in some of the drawings by dashed ellipses. For example, the open virtual valve corresponding to passive vent 112 is indicated in FIG. B and an open virtual valve corresponding to active vent 122 is shown in FIG. 1C. A virtual valve has a high, but not infinite, flow resistance when closed. Thus, a virtual valve does not physically block flow but instead uses a high flow resistance or high pressure to throttle or prevent flow. A virtual valve has a significantly lower flow resistance or pressure when open, allowing flow. In some embodiments, the ratio of flow resistances or pressures between closed and open for a virtual valve is at least three and not more than ten. Thus, active vent 122 and its virtual valve ("active virtual valve")

are considered closed in the suction arrangement because the flow resistance is sufficiently high that little or no fluid flows through active vent 122 in the suction arrangement. Passive vent 112 and its virtual valve ("passive virtual valve") are considered open in the suction arrangement because the pressure or flow resistance is sufficiently low to allow fluid to be drawn in to top chamber 140 through passive vent 112. In contrast, active vent 122 and active virtual valve are considered open in the expulsion arrangement because the pressure or flow resistance is sufficiently low to allow fluid to flow through active vent 122 and be driven out of orifices 132. Passive vent 112 and passive virtual valve are considered closed in the expulsion arrangement because the pressure or flow resistance is sufficiently high that little to no fluid is drawn through passive vent 112 in the expulsion arrangement.

Due to the vibrational motion of cooling elements 110 and 120 (and the attendant decrease in gap 142A/142B from FIG. 1B to FIG. 1C), the fluid is drawn in to top chamber 140 and through orifices 132. The motion of the fluid is shown by arrows through orifices 132. The fluid may spread as it travels away from orifice plate 130, as shown by dashed lines and arrows for some orifices 132 in FIG. 1C. The fluid deflects off of heat-generating structure 102 and travels along the channel between heat-generating structure 102 and orifice plate 130.

The motion between the positions shown in FIGS. 1B and 1C may be repeated. Thus, piezoelectric cooling elements 110 and 120 vibrate, drawing fluid through passive vent 112 from the distal side of cooling element 110, into top chamber 140, out of chamber 140 through active vent 122 and pushing the fluid through orifices 132 and toward heat-generating structure 102. In some embodiments the frequency of vibration of piezoelectric cooling element(s) 110 during operation is at least 15 kHz. In some embodiments, the frequency is at least 20 kHz. Thus, piezoelectric cooling elements 110 and 120 may operate in the ultrasonic range. Further, in some embodiments, piezoelectric cooling element(s) 110 and/or 120 may be driven at or near the resonant frequency. In some embodiments, the resonant frequency of piezoelectric cooling element(s) 110 and/or 120 is at least 15 kHz. The resonant frequencies of piezoelectric cooling element(s) 110 and 120 may also be desired to be close. In some embodiments, the resonant frequencies of piezoelectric cooling element(s) 110 and 120 are desired to be within one hundred Hertz. In some embodiments, feedback is used to maintain piezoelectric cooling element(s) 110 and/or 120 at or near resonance. For example, the current used to drive piezoelectric cooling element(s) 110 and/or 120 may be periodically measured and the driving frequency of piezoelectric cooling element(s) 110 and/or 120 adjusted to maintain resonance. In some embodiments, piezoelectric cooling element(s) 110 and/or 120 are driven within a few hundred Hertz of the resonant frequency/frequencies for optimized performance. However, other frequencies are possible. For example, the proximity of the driving frequency to the resonant frequency may be used to control flow. The further the driving frequency is from the resonant frequency, the lower the flow. The driving frequency may also be adjusted to maintain cooling element(s) 110 and/or 120 at or near one hundred and eighty degrees out-of-phase.

In some embodiments, the speed at which the fluid impinges on heat-generating structure 102 is at least thirty meters per second. In some embodiments, the fluid is driven by piezoelectric cooling elements 110 and 120 toward heat-generating structure 102 at a speed of at least forty meters per second. In some such embodiments, the fluid has a speed of at least forty-five meters per second. In some embodiments, the fluid has a speed of at least fifty-five meters per second. Further, in some embodiments, fluid speeds of at least sixty meters per second and/or seventy-five meters per second may be achieved. However, higher speeds may be possible in some embodiments. Fluid speeds in the range of thirty meters per second or more may be achievable in part due to judicious selection of the diameters of orifices 132.

As indicated in FIG. 1C, the fluid driven toward heat-generating structure 102 may move substantially normal (perpendicular) to the top surface of heat-generating structure 102. In other embodiments, the fluid motion may have a nonzero acute angle with respect to the normal to the top surface of heat-generating structure 102. In either case, the fluid may thin and/or form apertures in the boundary layer of fluid at heat-generating structure 102. The boundary layer in one case is indicated by the curved dotted lines at the top surface of heat-generating structure 102 in FIG. 1C. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. In the embodiment shown, chimneys 160 at the edges of cooling system 100 allow fluid to be carried away from heat-generating structure 102. In other embodiments, heated fluid may be transferred further from heat-generating structure 102 in another manner. The fluid may return to the distal side of cooling elements 110 where the fluid may exchange the heat transferred from heat-generating structure 102 to another structure or to the ambient environment. The fluid may then be circulated through cooling system 100 to extract additional heat. In other embodiments, heated fluid is carried away and replaced by new fluid at the distal side of cooling element 110. As a result, heat-generating structure 102 may be cooled.

Opening and closing of passive vent 112 (passive virtual valve) and active vent 122 (active virtual valve) to draw fluid into chamber 150 and expel fluid through orifices 132 is based upon dynamic changes to flow resistance. In some embodiments, the ratio of active suction flow resistance to active expulsion flow resistance is at least three. In some such embodiments, the ratio of active suction flow resistance to active expulsion flow resistance is not more than ten. In some embodiments, the ratio of passive expulsion flow resistance to passive suction flow resistance is at least three. In some such embodiments, the ratio of passive expulsion flow resistance to passive suction flow resistance is not more than ten. Thus, virtual valves corresponding to vents 112 and/or 122 may be opened and closed. These ratios of pressures may be considered to be due to the change in size of gap 142/142A/142B (e.g. five through thirty micrometers in some embodiments). In some embodiments, the difference in pressure between being open and closed is 0.1 atmosphere through 0.2 atmosphere. For example, the pressure at passive vent 112 in the suction arrangement may be at least 0.1 atmosphere and not more than 0.2 atmosphere less than the pressure at passive vent 112 in the expulsion arrangement. Similarly, the pressure at active vent 122 in the expulsion arrangement may be at least 0.1 atmosphere and not more than 0.2 atmosphere less than the pressure at active vent 122 in the suction arrangement.

Figure 2A:
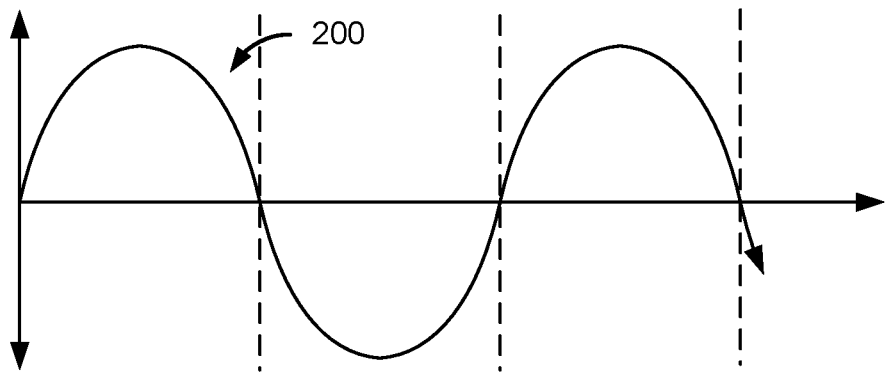
FIGS. 2A-2C are graphs depicting operation and driving of cooling elements in an embodiment of an active cooling system.
Figure 2B:
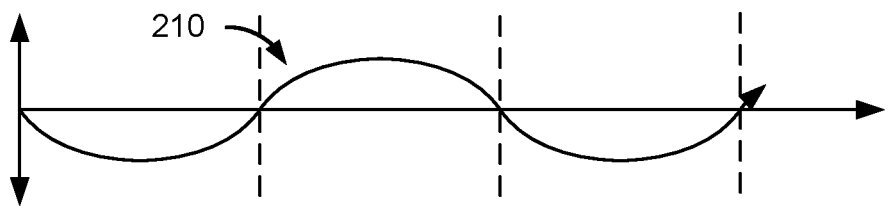
Figure 2C:
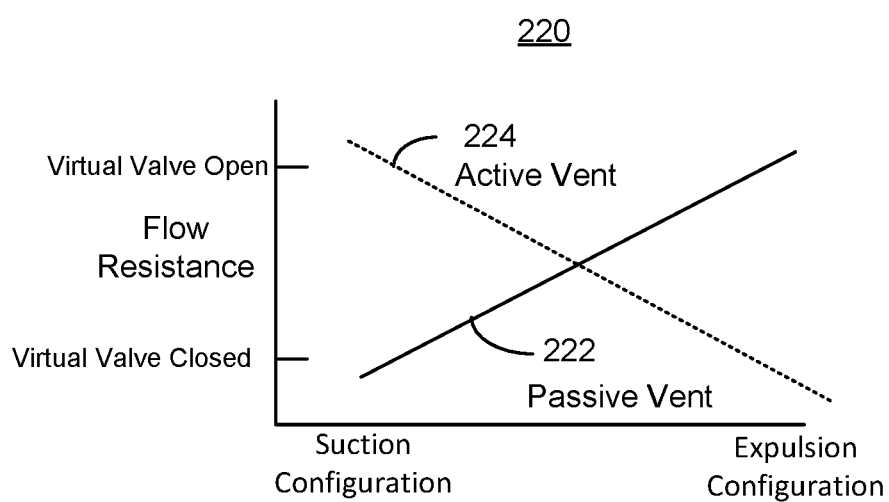

For example, FIGS. 2A-2C are graphs 200, 210 and 220 depicting operation and driving of cooling elements in an embodiment of an active cooling system. For simplicity, graphs 200, 210 and 220 are described in the context of cooling system 100. FIG. 2A is a graph 200 depicting the driving of cooling element 110. FIG. 2B is a graph 210 depicting driving of cooling element 120. FIG. 2C is a graph 220 depicting the flow resistance during vibration of cooling elements 110 and 120. As can be seen in FIGS. 2A-2B, cooling elements 110 and 120 are driven one hundred and eighty degrees out of phase. In the embodiment shown, the amplitude of vibration is also different for the cooling elements 110 and 120. In other embodiments, the amplitude of vibration may be the same or the amplitude of vibration for cooling element 120 may exceed that of cooling element 110. Thus, the suction arrangement of FIG. 1B and expulsion arrangement of FIG. 1C can be obtained. For example, the suction arrangement is shown in the first section of graphs 210 and 220 (with the situation of FIG. 1B occurring at the maximum of graph 200 and the minimum of graph 210), the expulsion arrangement is shown in the second section of graphs 210 and 220 (with the situation of FIG. 1C occurring at the minimum of graph 200 and the maximum of graph 210), and the suction arrangement shown again in the third section of graphs 210 and 220 (with the situation of FIG. 1B occurring at the maximum of graph 200 and the minimum of graph 210).

Graph 220 of FIG. 2C depicts the corresponding flow resistance 222 of passive vent 112 and flow resistance 224 of active vent 122. Thus, in suction arrangement, passive vent flow resistance 222 is low (passive virtual valve open), while active vent flow resistance 224 is high (active virtual valve closed). Fluid flows in through passive vent 112 in this suction arrangement. Although the suction arrangement is referred to as a single configuration (e.g. at the maxima/minima of graphs 200/210), fluid may flow into passive vent 112 throughout at least a portion of the first section of graphs 200 and 210. As cooling system 100 transitions to the expulsion arrangement, cooling elements 110 and 120 are actuated toward each other. Thus, passive vent flow resistance 222 increases (passive virtual valve closes), while active vent flow resistance 224 decreases (active virtual valve opens). This trend continues through the expulsion arrangement, for which active vent flow resistance 224 is low and passive vent flow resistance 222 is high. Although the expulsion arrangement is referred to as a single configuration (e.g. at the minima/maxima of graphs 200/210), fluid may flow out of active vent 122 throughout at least a portion of second first section of graphs 200 and 210. As cooling elements vibrate back toward the suction arrangement, the trend reverses. Thus, fluid is drawn into top chamber 140 and expelled through orifices 132.

Using the cooling system 100, fluid may be drawn in through passive vent 112 (in the suction arrangement) and driven through active vent 122 and orifices 132 (in the expulsion arrangement). Thus, the fluid may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Thus, cooling system 100 may be small-having a total height not exceeding five hundred micrometers. Consequently, cooling systems 100 may be suitable for use in mobile devices, such as smart phones, other mobile phones, virtual reality headsets, tablets, two-in-one computers, wearables and handheld games, in which limited space is available. Performance of mobile devices may thus be improved. The active cooling system may also be used in other compute devices. Because piezoelectric cooling element(s) 110 and/or 120 may be vibrated at frequencies of 15 kHz or more, users may not hear any noise associated with actuation of cooling elements. If driven at or near resonance frequency for the first and second piezoelectric cooling element(s), the power used in operating cooling systems may be significantly reduced.

Further, passive vent 112 and active vent 122 remain physically open throughout vibration. Instead of physically closing, virtual valves for vents 112 and 122 are opened and closed by providing sufficient differences in the flow resistance (or pressure at the vents) between the vents in the suction and expulsion arrangements. Cooling elements 110 and 120 do not physically contact each other to close active vent 122 or passive vent 112 during vibration. Similarly, cooling element 120 does not contact orifice plate 130 to close active vent 122. Thus, resonance of cooling element(s) 110 and/or 120 may be more readily maintained. More specifically, physical contact between cooling element(s) 110 and/or 120 and other structures disturbs the resonance conditions for cooling element(s) 110 and/or 120. Disturbing these conditions may drive cooling element(s) 110 and/or 120 out of resonance. Thus, additional power would need to be used to maintain actuation of cooling element(s) 110 and/or 120. Further, the fluid driven by cooling element(s) 110 and/or 120 may decrease. These issues are avoided through the use of virtual valves as discussed above. In addition, because cooling elements 110 and 120 are driven out of phase (e.g. one hundred and eighty degrees out-of-phase in some embodiments), sympathetic vibration may be achieved. For sympathetic vibration, additional motion of cooling elements 110 and/or 120 may be achieved. A larger change in the size of gap 142/142A/142B and, therefore, a higher volume of fluid flow may be obtained. The benefits of improved, quiet cooling may be achieved with limited additional power. Consequently, performance of devices incorporating the cooling system 100 may be improved.

Figure 3A:
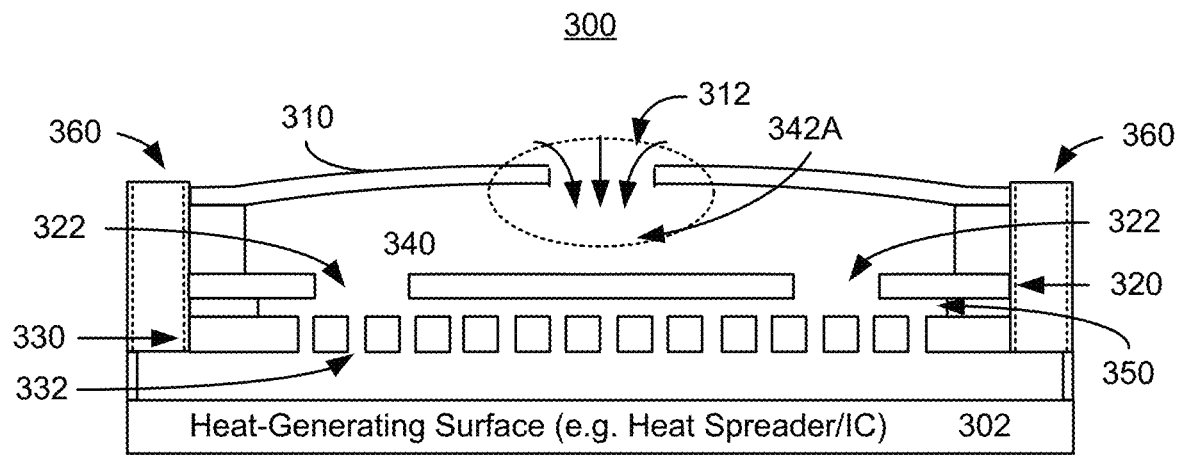
FIGS. 3A-3B are diagrams depicting another exemplary embodiment of an active cooling system usable with a structure.
Figure 3B:
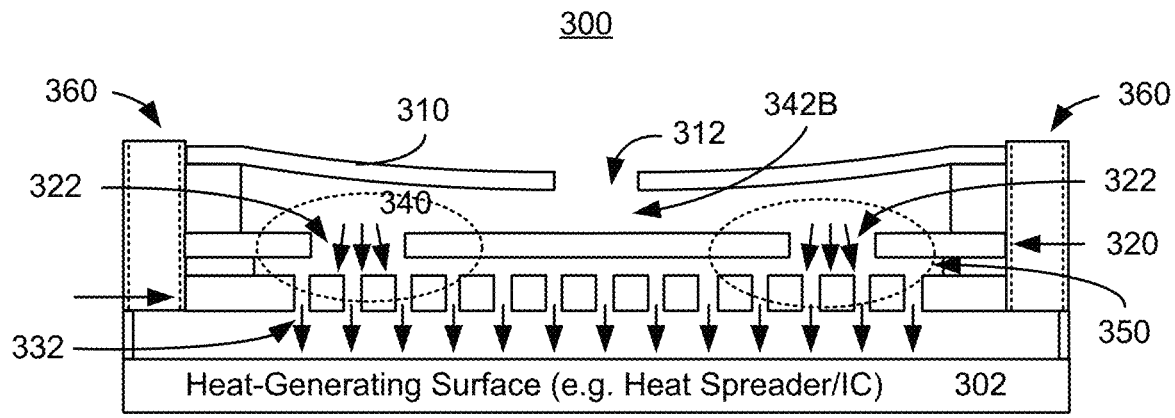

FIGS. 3A-3B are diagrams depicting an exemplary embodiment of active cooling system 300 usable with a heat-generating structure 302. For clarity, only certain components are shown and FIGS. 3A-3B are not to scale. FIGS. 3A-3B depict operation of cooling system 300. Cooling system 300 is used in connection with a heat-generating structure 302.

Cooling system 300 and heat-generating structure 302 are analogous to cooling system 100 and heat-generating structure 102, respectively. Thus, cooling system 300 includes piezoelectric cooling elements 310 and 320, orifice plate 330 having orifices 332 therein, top chamber 340 having gap 342A/342B, bottom chamber 350 and optional chimneys 360. Piezoelectric cooling system 300 may be a MEMS device and thus may have dimensions analogous to those described above. However, in the embodiment shown, only cooling element 310 is actuated to vibrate between positions shown in FIGS. 3A and 3B. In the embodiment shown, therefore, cooling element 320 might be omitted or may simply be a stationary plate having vent(s) 322 therein.

Referring to FIG. 3A, piezoelectric cooling element 310 has been actuated to move away from (deform to be convex) heat-generating structure 302. This configuration is the suction arrangement. Because of the vibrational motion of piezoelectric cooling element 310, the gap has increased in size from its neutral position and is shown as gap 342A. For example, gap 342A may have a height of at least twenty and not more than thirty micrometers in the suction arrangement (FIG. 3A). Thus, top chamber 340 has increased in volume. In the suction arrangement, the flow resistance of passive vent 312 (passive suction flow resistance) is low. Consequently, the pressure at passive vent 312 is low and the corresponding passive virtual valve is open. In contrast, the flow resistance of active vent 322 (active suction flow resistance) is relatively high. Consequently, the pressure at active vent 322 is relatively high and the active virtual vent is closed. Because of the low passive suction flow resistance, fluid is drawn into top chamber 340 through passive vent 312. This is shown by arrows in FIG. 3A. However, fluid does not flow out of (or flows out to a limited extent) active vent 322. Thus, active vent 322 and the corresponding active virtual valve are considered closed and passive vent 312 and corresponding passive virtual valve are considered open in the suction arrangement. However, active vent 322 is not physically closed in this configuration. For example, active vent 322 is not in contact with orifice plate 330 in the suction arrangement. In the suction arrangement, therefore, the virtual valve for active vent 322 is closed while the virtual valve for passive vent 312 is open.

FIG. 3B depicts an expulsion arrangement. Piezoelectric cooling element 310 has been actuated to move toward (deform to be concave) heat-generating structure 302. Because of the vibrational motion of piezoelectric cooling element 310, the gap decreased in size from its neutral position and is shown as gap 342B. For example, in some embodiments, gap 342B has a height of at least five and not more than ten micrometers in the expulsion arrangement. Thus, top chamber 340 has decreased in volume. In the expulsion arrangement, the flow resistance of passive vent 312 (passive expulsion flow resistance) is high. Consequently, the pressure at passive vent 312 is high. The passive virtual valve corresponding to passive vent 312 is considered closed. In contrast, the flow resistance of active vent 322 (active expulsion flow resistance) is relatively low. Consequently, the pressure at active vent 322 is relatively low. Thus, the active virtual valve corresponding to active vent 322 is open. Because of the low active expulsion flow resistance, fluid is expelled from top chamber 340 through active vent 322, into bottom chamber 350 and through orifices 332. This is shown by arrows in FIG. 3B. However, fluid does not flow out of (or flows out to a limited extent) passive vent 312 because of the high passive expulsion flow resistance. Thus, the passive virtual valve for passive vent 312 is considered closed, while the active virtual valve for active vent 322 is considered open in the expulsion arrangement. However passive vent 312 is not physically closed in this configuration. For example, passive vent 312 is not in contact with cooling element 320 in the expulsion arrangement. Gap 342B does not have a zero length.

Cooling system 300 may share the benefits of cooling system 100. Cooling system 300 may more efficiently dissipate heat from heat-generating structure 302 for the reasons discussed above. Thus, performance of a device utilizing cooling system 300 may be improved. Further, cooling system 300 may be a MEMS device having the dimensions described above. Thus, piezoelectric cooling system 300 is suitable for use in mobile devices, such as smart phones, in which limited space is available. Piezoelectric cooling system 300 may also be used in other compute devices-both mobile and non-mobile. Performance of such devices may thus be improved. Because piezoelectric cooling elements 310 and/or 320 may be vibrated at ultrasonic frequencies and/or at or near resonance, piezoelectric cooling system 300 may be quieter and consume less power. Because vents 312 and 322 remain physically open, cooling elements 310 and/or 320 may not contact each other (or orifice plate 330) during use. Thus, resonance of cooling elements 310 and/or 320 may more easily be maintained. The benefits of improved, quiet cooling may be achieved with limited additional power. Consequently, performance of devices incorporating cooling system 300 may be improved.

Figure 4A:
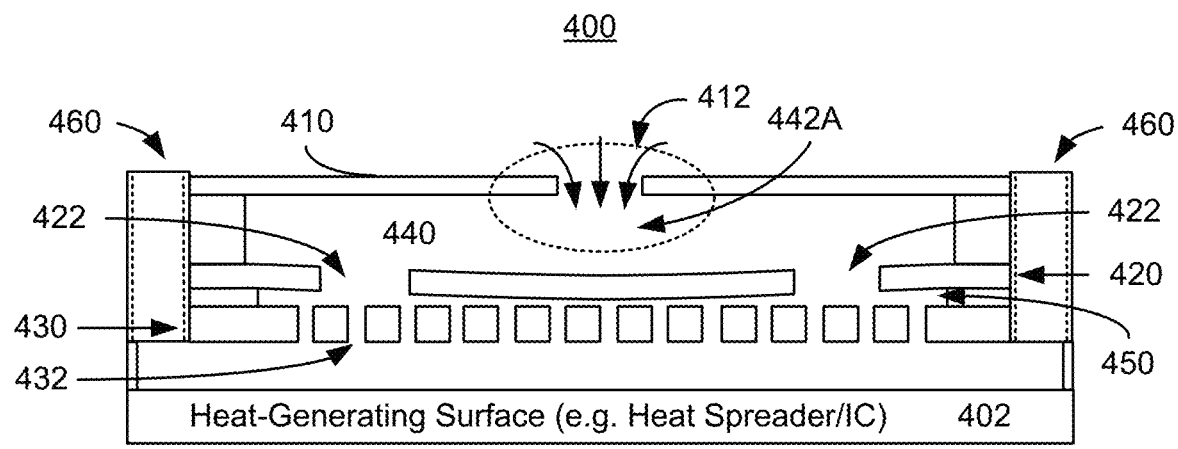
FIGS. 4A-4B are diagrams depicting another exemplary embodiment of an active cooling system usable with a structure.
Figure 4B:
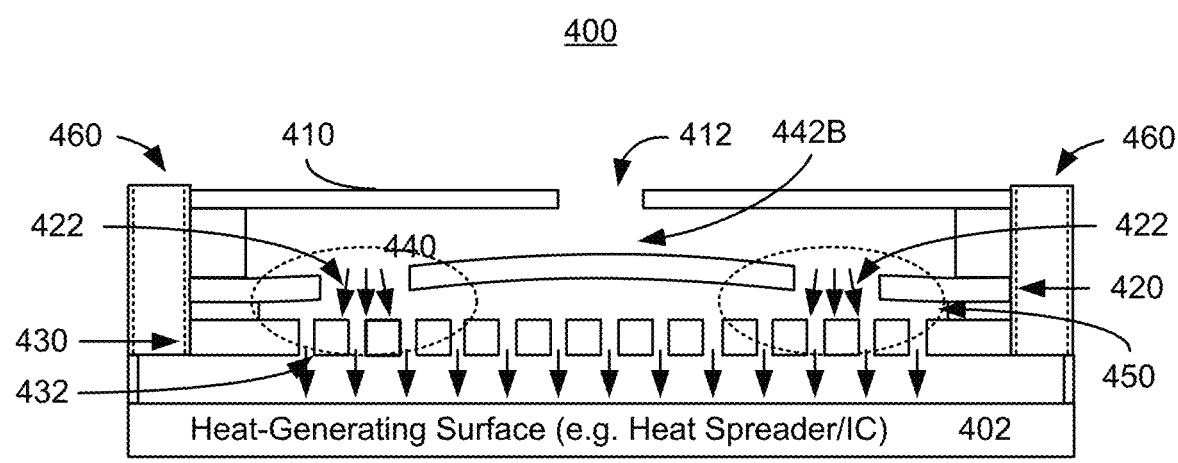

FIGS. 4A-4B are diagrams depicting an exemplary embodiment of active cooling system 400 usable with a heat-generating structure 402. For clarity, only certain components are shown and FIGS. 4A-4B are not to scale. FIGS. 4A-4B depict operation of cooling system 400. Cooling system 400 is used in connection with a heat-generating structure 402.

Cooling system 400 and heat-generating structure 402 are analogous to cooling system(s) 100 and/or 300 and heat-generating structure(s) 102 and/or 302, respectively. Thus, cooling system 400 includes piezoelectric cooling elements 410 and 420, orifice plate 430 having orifices 432 therein, top chamber 440 having gap 442A/442B, bottom chamber 450 and optional chimneys 460. Piezoelectric cooling system 400 may be a MEMS device and thus may have dimensions analogous to those described above. However, in the embodiment shown, only cooling element 420 is actuated to vibrate between positions shown in FIGS. 4A and 4B. In the embodiment shown, therefore, cooling element 410 might be omitted or may simply be a stationary plate having a vent 412 therein.

Referring to FIG. 4A, piezoelectric cooling element 420 has been actuated to move toward (deform to be concave) heat-generating structure 402. This configuration is the suction arrangement. Because of the vibrational motion of piezoelectric cooling element 420, the gap has increased in size from its neutral position and is shown as gap 442A. For example, gap 442A may have a height of at least twenty and not more than thirty micrometers in the suction arrangement (FIG. 4A). Thus, top chamber 440 has increased in volume and bottom chamber 450 has decreased in volume. In the suction arrangement, the flow resistance of passive vent 412 (passive suction flow resistance) is relatively low. Consequently, the pressure at passive vent 412 is relatively low and passive virtual valve (indicated by the dashed ellipse in FIG. 4A) is open. In contrast, the flow resistance of active vent 422 (active suction flow resistance) is high. Consequently, the pressure at active vent 422 is high and active virtual valve is closed. Because of the low passive suction flow resistance, fluid is drawn into top chamber 440 through passive vent 412. This is shown by arrows in FIG. 4A. However, fluid does not flow out of (or flows out to a limited extent) active vent 422. The passive virtual valve for passive vent 412 is open, while the active virtual valve for active vent 422 is closed in the suction arrangement. However, active vent 422 is not physically closed in this configuration. For example, active vent 422 is not in contact with orifice plate 430 in the suction arrangement.

FIG. 4B depicts an expulsion arrangement. Piezoelectric cooling element 420 has been actuated to move away from (deform to be convex) heat-generating structure 402.

Because of the vibrational motion of piezoelectric cooling element 420, the gap decreased in size from its neutral position size and is shown as gap 442B. For example, in some embodiments, gap 442B has a height of at least five and not more than ten micrometers in the expulsion arrangement. Thus, top chamber 440 has decreased in volume and bottom chamber 450 has increased in volume. In the expulsion arrangement, the flow resistance of passive vent 412 (passive expulsion flow resistance) is relatively high. Consequently, the pressure at passive vent 412 is relatively high and the passive virtual valve is closed. In contrast, the flow resistance of active vent 422 (active expulsion flow resistance) is low. Consequently, the pressure at active vent 422 is low and the active virtual valve (indicated by the dashed ellipse in FIG. 4A) is open. Because of the low active expulsion flow resistance, fluid is expelled from top chamber 440 through active vent 422, into bottom chamber 450 and through orifices 432. This is shown by arrows in FIG. 4B. However, fluid does not flow out of (or flows out to a limited extent) passive vent 412 because of the relatively high passive expulsion flow resistance. Thus, the virtual valve for passive vent 412 is considered closed and the virtual valve for active vent 422 is considered open in the expulsion arrangement. However passive vent 412 is not physically closed in this configuration. For example, passive vent 412 is not in contact with cooling element 420 in the expulsion arrangement. Gap 442B does not have a zero length.

Cooling system 400 may share the benefits of cooling system 100 and/or 300. Cooling system 400 may more efficiently dissipate heat from heat-generating structure 402 for the reasons discussed above. Further, cooling system 400 may be a MEMS device having the dimensions described above. Thus, piezoelectric cooling system 400 is suitable for use in mobile devices, such as smart phones, in which limited space is available. Piezoelectric cooling system 400 may also be used in other compute devices-both mobile and non-mobile. Performance of such devices may thus be improved. Because piezoelectric cooling elements 410 and/or 420 may be vibrated at ultrasonic frequencies and/or at or near resonance, piezoelectric cooling system 400 may be quieter and consume less power. Because vents 412 and 422 remain physically open, cooling elements 410 and/or 420 may not contact each other (or orifice plate 430) during use. Thus, resonance of cooling elements 410 and/or 420 may more easily be maintained. The benefits of improved, quiet cooling may be achieved with limited additional power. Consequently, performance of devices incorporating cooling system 400 may be improved.

Figure 5A:
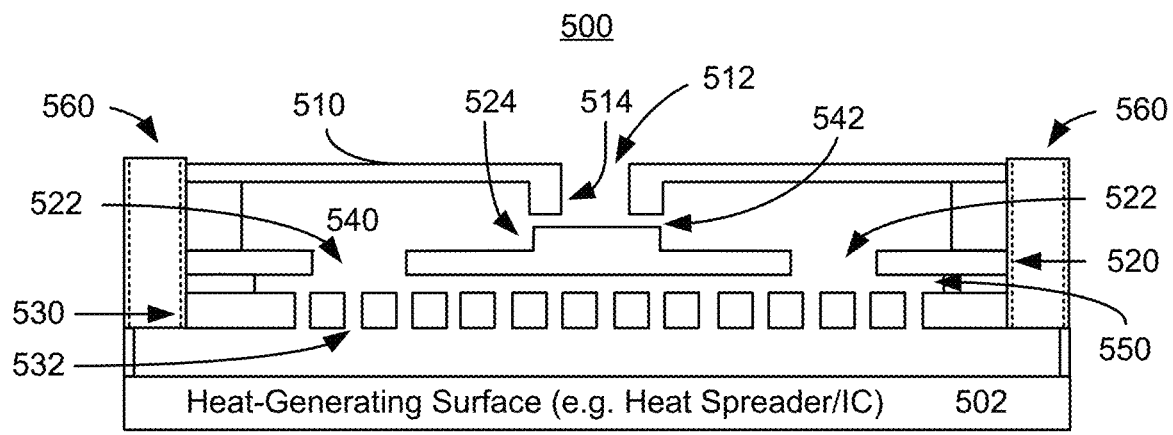
FIGS. 5A-5C are diagrams depicting another exemplary embodiment of an active cooling system usable with a structure.
Figure 5B:
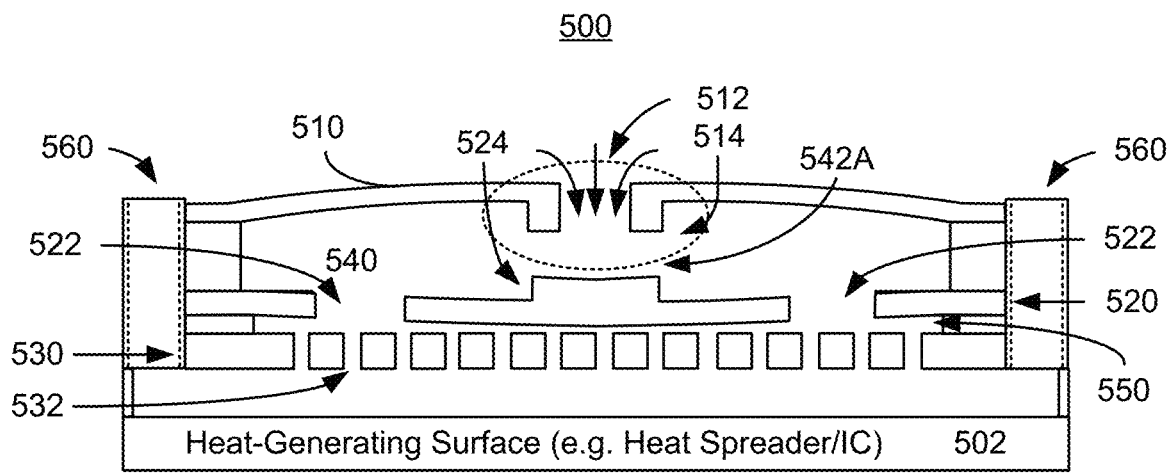
Figure 5C:
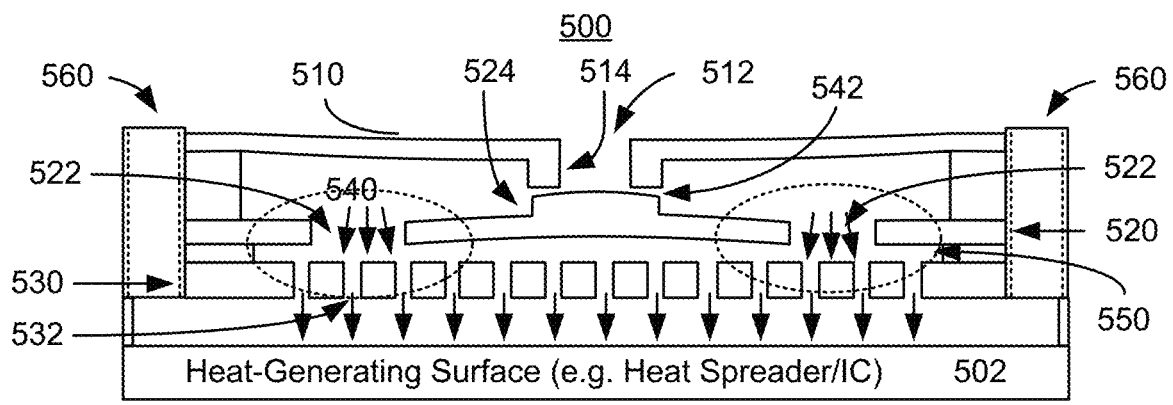

FIGS. 5A-5C are diagrams depicting an exemplary embodiment of active cooling system 500 usable with a heat-generating structure 502. For clarity, only certain components are shown and FIGS. 5A-5C are not to scale. FIGS. 5A, 5B and 5C depict neutral, suction and expulsion arrangements of cooling system 500. Cooling system 500 is used in connection with a heat-generating structure 502. Cooling system 500 and heat-generating structure 502 are analogous to cooling system(s) 100, 300 and/or 400 and heat-generating structure(s) 102, 302 and/or 402, respectively. Thus, cooling system 500 includes piezoelectric cooling elements 510 and 520, orifice plate 530 having orifices 532 therein, top chamber 540 having gap 542/542A/ 542B, bottom chamber 550 and optional chimneys 560. Piezoelectric cooling system 500 may be a MEMS device and thus may have dimensions analogous to those described above.

FIG. 5A depicts cooling system 500 in a neutral configuration. Thus, cooling elements 510 and 520 are shown as substantially flat. Cooling element 510 includes not only passive vent 512, but also a landing 514 adjacent to passive vent 514. In some embodiments, landing 514 extends around the perimeter of passive vent 514. Similarly, cooling element 520 includes plug 524 opposite to and aligned with passive vent 514. In some embodiments, either landing 514 or plug 524 might be omitted. In some embodiments, cooling element 510 might include plug(s) opposite to and aligned with active vents 522. Similarly, cooling element 520 might include landing(s) adjoining active vent(s) 522. In some embodiments, such landing(s) may extend around the perimeter of active vent(s) 522. Landing 514 and/or plug 524 may be used to reduce the size of gap 542 and provide an impediment to fluid flow. The dynamic resistances of the passive vent 512 and/or active vents 522 may be configured by the size (area and/or height perpendicular to heat-generating structure 502) of landing 514 and/or plug 524. For example, the open and closed pressures may be varied from at least four kiloPascals to not more than forty kiloPascals in some embodiments. Thus, landing 514 and/or plug 524 allow for the resistances to flow for vents 512 and 522 in the virtual valve opened and virtual valve closed positions (e.g. the suction and expulsion arrangements) to be better tailored.

In FIG. 5B, piezoelectric cooling element 510 has been actuated to move away from heat-generating structure 502 (deform to be convex), while piezoelectric cooling element 520 has been actuated to move toward (deform to be concave) heat-generating structure 502. This configuration is the suction arrangement. In the embodiment shown, cooling system 500 is driven such that cooling elements 510 and 520 are one hundred eighty degrees out of phase. Because of the vibrational motion of piezoelectric cooling elements 510 and 520, the gap 542 has increased in size from its neutral position and is shown as gap 542A. For example, gap 542A may have a height of at least twenty and not more than thirty micrometers in the suction arrangement (FIG. 5B). Thus, top chamber 540 has increased in volume and bottom chamber 550 has decreased in volume. In the suction arrangement, the flow resistance of passive vent 512 (passive suction flow resistance) is low. Consequently, the pressure at passive vent 512 is low and the passive virtual valve is open. In contrast, the flow resistance of active vent 522 (active suction flow resistance) is high. Consequently, the pressure at active vent 522 is high and active virtual vent is closed. Because of the low passive suction flow resistance, fluid is drawn into top chamber 540 through passive vent 512. This is shown by arrows in FIG. 5A. However, fluid does not flow out of (or flows out to a limited extent) active vent 522. Thus, the active virtual valve for active vent 522 is considered closed and the passive virtual valve for passive vent 512 is considered open in the suction arrangement. However, active vent 522 is not physically closed in this configuration. For example, active vent 522 is not in contact with orifice plate 530 in the suction arrangement.

FIG. 5C depicts an expulsion arrangement. Piezoelectric cooling element 510 is actuated to move toward (deform to be concave) heat-generating structure 502, while piezoelectric cooling element 520 has been actuated to move away from (deform to be convex) heat-generating structure 502. Because of the vibrational motion of piezoelectric cooling elements 510 and 520, the gap decreased in from its neutral position size and is shown as gap 542B. For example, in some embodiments, gap 542B has a height of at least five and not more than ten micrometers in the expulsion arrangement. Thus, top chamber 540 has decreased in volume and bottom chamber 550 has increased in volume. In the expulsion arrangement, the flow resistance of passive vent 512 (passive expulsion flow resistance) is high. Consequently, the pressure at passive vent 512 is high. In contrast, the flow resistance of active vent 522 (active expulsion flow resistance) is low. Consequently, the pressure at active vent 522 is low. Because of the low active expulsion flow resistance, fluid is expelled from top chamber 540 through active vent 522, into bottom chamber 550 and through orifices 532. This is shown by arrows in FIG. 5C. However, fluid does not flow out of (or flows out to a limited extent) passive vent 512 because of the high passive expulsion flow resistance. Thus, the passive virtual valve for passive vent 512 is considered closed and the active virtual valve for active vent 522 is considered open in the expulsion arrangement. Because of the presence of plug 524 and landing 514, the length of gap 542B is further reduced and the pressure (flow resistance) for passive vent 512 is further increased in the expulsion arrangement. However passive vent 512 is not physically closed in this configuration. For example, passive vent 512 is not in contact with cooling element 520 in the expulsion arrangement. Thus, although landing 514 and plug 524 may be very close, landing 514 and plug 524 are not in physical contact. Gap 542B does not have a zero length.

Cooling system 500 may share the benefits of cooling system 100, 300 and/or 400. Cooling system 500 may more efficiently dissipate heat from heat-generating structure 502 for the reasons discussed above. Because piezoelectric cooling elements 510 and/or 520 may be vibrated at ultrasonic frequencies and/or at or near resonance, piezoelectric cooling system 500 may be quieter and consume less power. Because vents 512 and 522 remain physically open, cooling elements 510 and/or 520 may not contact each other (or orifice plate 530) during use. Thus, resonance of cooling elements 510 and/or 520 may more easily be maintained. Use of landing 514 and/or plug 524 may further increase the resistance to flow in the expulsion arrangement. The benefits of improved, quiet cooling may be achieved with limited additional power. Consequently, performance of devices incorporating cooling system 500 may be improved.

Figure 6:
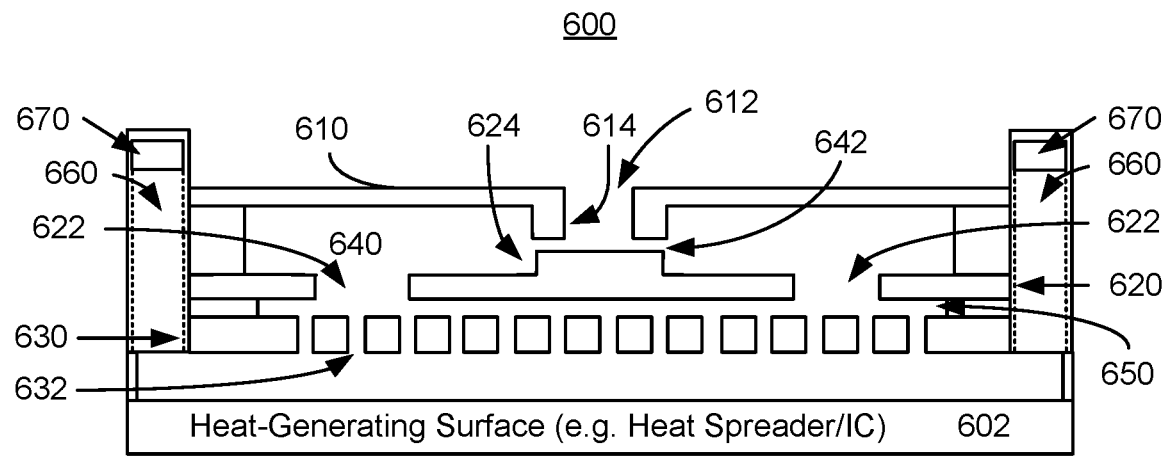
FIG. 6 is a diagram depicting another exemplary embodiment of an active cooling system usable with a structure.

FIG. 6 is a diagram depicting an exemplary embodiment of active cooling system 600 usable with a heat-generating structure 602. For clarity, only certain components are shown and FIG. 6 is not to scale. FIG. 6 depicts a neutral configuration of cooling system 600. Cooling system 600 is used in connection with a heat-generating structure 602. Cooling system 600 and heat-generating structure 602 are analogous to cooling system(s) 100, 300, 400 and/or 500 and heat-generating structure(s) 102, 302, 402 and/or 502, respectively. Thus, cooling system 600 includes piezoelectric cooling elements 610 and 620, passive vent 612, active vent 622, landing 614, plug 624, orifice plate 630 having orifices 632 therein, top chamber 640 having gap 642, bottom chamber 650 and optional chimneys 660. Cooling elements 610 and/or 620 are actuated to vibrate, opening and closing the virtual valves for active vent 622 and passive vent 612 in a manner analogous to that described above. Consequently, suction and expulsion arrangements analogous to those described above are also provided. Piezoelectric cooling system 600 may be a MEMS device and thus may have dimensions analogous to those described above.

FIG. 6 depicts cooling system 600 in a neutral configuration. Cooling elements 610 and/or 620 may be driven to be actuated in a manner analogous to cooling systems 100, 300, 400 and/or 500. Thus, fluid is drawn in through passive vent 612 (passive valve open) and flows into top chamber 640 in the suction arrangement. Fluid is expelled out of top chamber 640 through active vents 622 (active valves open) and through orifices 632 in the expulsion arrangement. In some embodiments, the fluid speeds and cooling power described above may be achieved. Fluid flows along heat-generating structure 602 toward chimneys 660. Heat is transferred from heat-generating structure 602 to the fluid. The fluid flows to chimneys 660 and is carried away from heat-generating structure 602. In addition, ducting 670 carries heated fluid away from passive vent 612, for example to edges of cooling system 600 or the device employing cooling system 600. As a result, the heated fluid is less likely to be rapidly drawn back into passive vent 612 in a suction arrangement. In some embodiments, chimneys 660 may be omitted. In such embodiments, ducting 670 may receive heated fluid directly from the region between orifice plate 630 and heat-generating structure 602. In some embodiments, ducting 670 may provide a path for heated fluid in other and/or additional direction(s) to that shown. In addition, ducting 670 may provide additional mechanical stability to cooling system 600 and cooling elements 610 and 620.

Cooling system 600 may share the benefits of cooling system 100, 300 and/or 400. Cooling system 600 may more efficiently dissipate heat from heat-generating structure 602 for the reasons discussed above. In addition, because of the presence of ducting 670, cooling system 600 may more efficiently cool heat-generating structure 602. Because piezoelectric cooling elements 610 and/or 620 may be actuated to vibrate at ultrasonic frequencies and/or at or near resonance, piezoelectric cooling system 600 may be quieter and consume less power. Because vents 612 and 622 remain physically open (e.g. virtual valves are used), cooling elements 610 and/or 620 may not contact each other (or orifice plate 630) during use. Thus, resonance of cooling elements 610 and/or 620 may more easily be maintained. Use of landing 614 and/or plug 624 may further increase the resistance to flow in the expulsion arrangement. Ducting 670 may also improve the mechanical stability of cooling system 600. For example, if cooling system 600 is used in an array of multiple cooling elements, the presence of ducting 670 may better isolate the vibration of cooling elements 610 and/or 620 in each cooling system 600 from vibrations in another cooling system 600. The benefits of improved, quiet cooling may be achieved with limited additional power. Consequently, performance of devices incorporating cooling system 600 may be improved.

Figure 7:
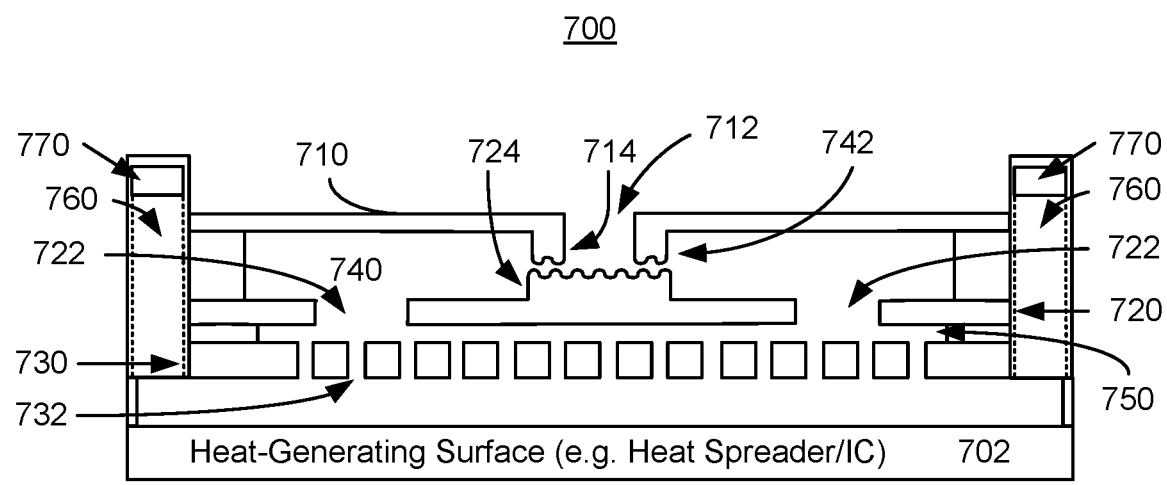
FIG. 7 is a diagram depicting another exemplary embodiment of an active cooling system usable with a structure.

FIG. 7 is a diagram depicting an exemplary embodiment of active cooling system 700 usable with a heat-generating structure 702. For clarity, only certain components are shown and FIG. 7 is not to scale. FIG. 7 depicts a neutral configuration of cooling system 700. Cooling system 700 is used in connection with a heat-generating structure 702. Cooling system 700 and heat-generating structure 702 are analogous to cooling system(s) 100, 300, 400, 500 and/or 600 and heat-generating structure(s) 102, 302, 402, 502 and/or 602, respectively. Thus, cooling system 700 includes piezoelectric cooling elements 710 and 720, passive vent 712, active vent 722, landing 714, plug 724, orifice plate 730 having orifices 732 therein, top chamber 740 having gap 742, bottom chamber 750, optional chimneys 760 and ducting 770. Cooling elements 710 and/or 720 are actuated to vibrate as described above. Consequently, suction and expulsion arrangements analogous to those described above are also provided. Piezoelectric cooling system 700 may be a MEMS device and thus may have dimensions analogous to those described above.

FIG. 7 depicts cooling system 700 in a neutral configuration. Cooling elements 710 and/or 720 may be driven to be actuated in a manner analogous to cooling systems 100, 300, 400, 500 and/or 600. Thus, fluid is drawn in through passive vent 712 (passive valve open) and flows into top chamber 740 in the suction arrangement. Fluid is expelled out of top chamber 740 through active vents 722 (active valves open) and through orifices 732 in the expulsion arrangement. In some embodiments, the fluid speeds and cooling power described above may be achieved. Fluid flows along heat-generating structure 702 toward optional chimneys 760. Heat is transferred from heat-generating structure 702 to the fluid. The fluid flows away from heat-generating structure 702 through optional chimneys 760 or via another mechanism. Optional ducting 770 carries heated fluid away from passive vent 712. As a result, the heated fluid is less likely to be rapidly drawn back into passive vent 712 in a suction arrangement. Ducting 770 may provide additional mechanical stability to cooling system 700 and cooling elements 710 and 720. In some embodiments, ducting 770 and/or chimneys 760 may be omitted or configured differently.

Also in FIG. 7, plug 724 and landing 714 are shown as having variations in the facing surfaces (e.g. the surfaces of plug 724 and landing 714 are not flat). Although both plug 724 and landing 714 are shown as having surface variations, in other embodiments, only one of plug 724 and landing 714 include such variations. In some embodiments, the variations may extend only across a portion of the surface of plug 724 and/or landing 714. Thus, the surface of plug 724 and the surface of landing 714 form a tortuous path for fluid traveling through gap 742. Consequently, fluid entering or exiting top chamber 740 through passive vent 712 is slowed by the variations in the facing surfaces. For example, within manufacturing tolerances, the pitch of the variations (or corrugations) may be at least fifty and not more than two hundred micrometers. Thus, the number of corrugations may be from one to as many fit on a particular geometric surface, with the height of corrugations varying from at least fifty to not more than two hundred micrometers. The initial gap between the top and bottom variations on cooling elements 710 and 720 can be positive, zero or negative, depending on the resistance, pressure and flow requirements dictated by the design. Further, the corrugations may be configured to tune flow and pressure in chamber 740. Thus, the difference in pressure between the open and closed states of passive vent 712 and/or active vent 722 may be increased by the use of the tortuous path. Stated differently, the pressure difference between a large gap 742 (suction arrangement) and a small gap 742 (expulsion arrangement) can be increased. However, gap 742 still has a nonzero height throughout operation of cooling system 700.

Cooling system 700 may share the benefits of cooling system 100, 300, 400, 500 and/or 600. Cooling system 700 may more efficiently dissipate heat from heat-generating structure 702 for the reasons discussed above. In addition, because of the presence of ducting 770, cooling system 700 may more efficiently cool heat-generating structure 702. Because piezoelectric cooling elements 710 and/or 720 may be actuated to vibrate at ultrasonic frequencies and/or at or near resonance, piezoelectric cooling system 700 may be quieter and consume less power. Because vents 712 and 722 remain physically open, cooling elements 710 and/or 720 may not contact each other (or orifice plate 730) during use. Thus, resonance of cooling elements 710 and/or 720 may more easily be maintained. Use of landing 714 and/or plug 724 having surface variations may further increase the resistance to flow in the expulsion arrangement. Ducting 770 may also improve the mechanical stability of cooling system 700. For example, if cooling system 700 is used in an array of multiple cooling elements, the presence of ducting 770 may better isolate the vibration of cooling elements 710 and/or 720 in each cooling system 700 from vibrations in another cooling system 700. The benefits of improved, quiet cooling may be achieved with limited additional power. Consequently, performance of devices incorporating cooling system 700 may be improved.

Figure 8A:
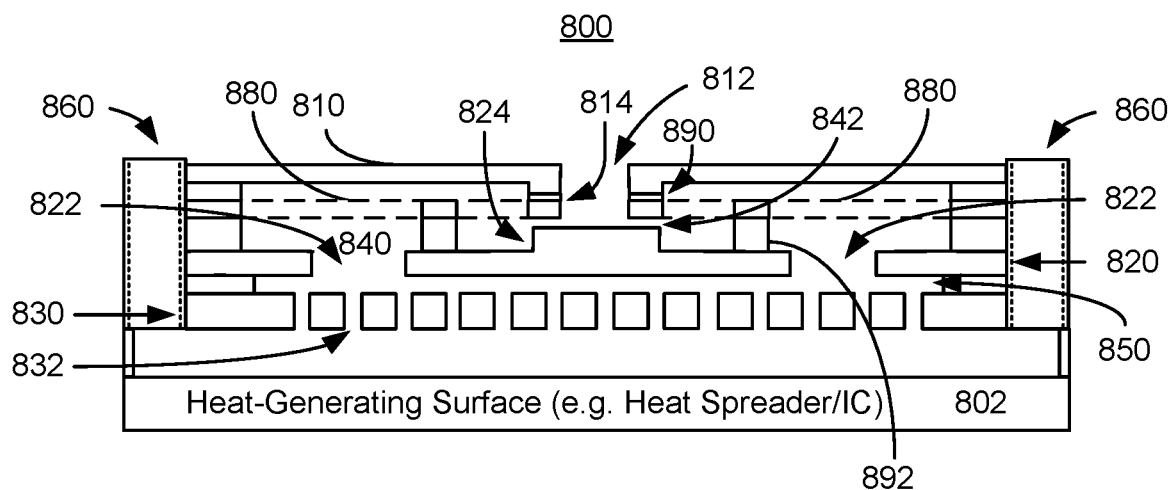
FIGS. 8A-8C are diagrams depicting another exemplary embodiment of an active cooling system usable with a structure.
Figure 8B:
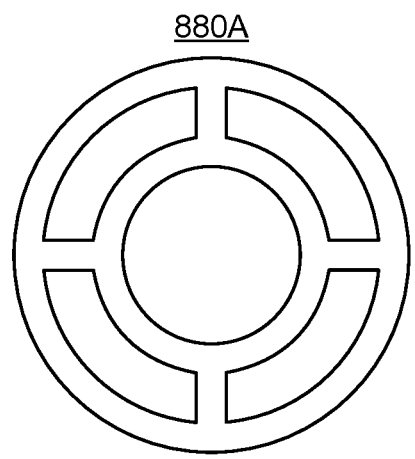
Figure 8C:
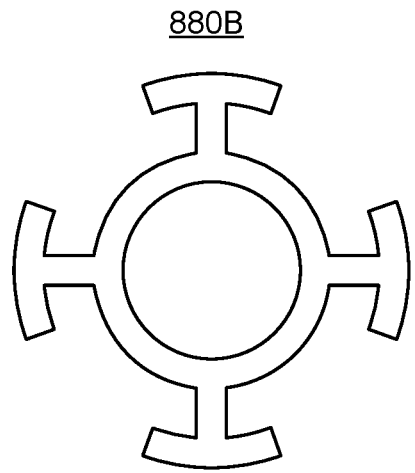

FIGS. 8A-8C are diagrams depicting an exemplary embodiment of active cooling system 800 usable with a heat-generating structure 802 and elastic structures usable in such a cooling system. FIG. 8A depicts cooling system 800. FIGS. 8B and 8C depict embodiments 880A and 880B of elastic devices usable in cooling system 800. For clarity, only certain components are shown and FIGS. 8A and 8B are not to scale. Cooling system 800 is used in connection with a heat-generating structure 802. Cooling system 800 and heat-generating structure 902 are analogous to cooling system(s) 100, 300, 400, 500, 600 and/or 700 and heat-generating structure(s) 102, 302, 402, 502, 602 and/or 702, respectively. Thus, cooling system 800 includes piezoelectric cooling elements 810 and 820, passive vent 812, active vent 822, landing 814, plug 824, orifice plate 830 having orifices 832 therein, top chamber 840 having gap 842, bottom chamber 850 and optional chimneys 860. Ducting (not shown) may also be included. Cooling elements 810 and/or 820 are actuated to vibrate as described above. Consequently, suction and expulsion arrangements analogous to those described above are also provided. Piezoelectric cooling system 800 may be a MEMS device and thus may have dimensions analogous to those described above.

FIG. 8A depicts cooling system 800 in a neutral configuration. Cooling elements 810 and/or 820 may be driven to be actuated in a manner analogous to cooling systems 100, 300, 400, 500, 600 and/or 700. Thus, fluid is drawn in through passive vent 812 and flows into top chamber 840 in the suction arrangement. Fluid is expelled out of top chamber 840 through active vents 822 and through orifices 832 in the expulsion arrangement. In some embodiments, the fluid speeds and cooling power described above man be achieved. Fluid flows along heat-generating structure 802 toward optional chimneys 860. Heat is transferred from heat-generating structure 802 to the fluid. The fluid flows away from heat-generating structure 802 through optional chimneys 860 or via another mechanism.

Also shown in cooling system 800 is elastic device 880. Elastic device 880 is affixed to cooling element 810 and 820 via structures 890 and 892. Note that only some structures are labeled in FIG. 8A. In some embodiments, elastic device 880 is formed of the same material(s) as cooling element(s) 810 and/or 820. For example, elastic device 880 may be formed of stainless steel or a Ni alloy. In other embodiments, other material(s) might be used. The spring constant for elastic device 880 may be selected to be at least five percent and not more than twenty-five percent of the stiffness of cooling element(s) 810 and/or 820. This selection provides a balance between the variations and the magnitude of deflection of cooling elements 810 and 820. In other embodiments, another stiffness for the elastic device 880 may be selected. Structures 890 and 892 may be epoxy, adhesive, PSA, solder, brazed joints or some other mechanism for bonding elastic device 880 to cooling elements 810 and 820. Elastic device 880 couples cooling elements 810 and 820, but does not prevent fluid flow through cooling system 800. Thus, portions of elastic device 880 that may include apertures are depicted with a dashed line. Elastic device 880 is used to link the vibrations of cooling elements 810 and 820. Because of the present of elastic device 880, small variations in the vibrations of cooling element(s) 810 and/or 820 may not make substantially one hundred and eighty degree out-of-phase resonant vibration unstable. Stated differently, elastic device 880 may stabilize the frequency mode between cooling element 810 and 820. The natural frequency of the cooling elements 810 and 820 may be chosen to be similar. The elastic device 880 stabilizes the frequency and the mode to be the out-of-phase mode. Without elastic device 880, it may be very difficult to maintain the operation of cooling elements 810 and 820 in the appropriate mode. In some cases, maintaining operation of system 800 at resonance without elastic device 880 is challenging because the coupled mechanics of fluid pressures and structural mechanics tend to drive cooling elements 810 and 820 at different peak resonances. With the elastic device, system 800 may be more easily operated at resonance. For example, use of elastic device 880 may allow resonant frequencies of cooling elements 810 and 820 may differ by five to ten percent of the base frequency. For example, the resonant frequencies of cooling elements 810 and 820 may differ by up to one kHz but still be operated at resonance if elastic device 880 is incorporated. Consequently, cooling elements 810 and 820 may be more easily controlled to remain both at frequencies of vibration near resonance and out-of-phase. Thus, efficiency of cooling system 800 in driving fluid may be maintained or improved.

FIGS. 8B and 8C depict portions of embodiments 880A and 880B of elastic device 880. Elastic devices 880A and 880B are affixed to cooling elements 810 and 820 at locations 882 and 884, respectively. In some embodiments, elastic devices 880A and 880B include additional portions that are affixed to the edges of cooling system 800. Elastic device 880 in FIG. 8A is depicted as including such portions. Elastic device 880A includes concentric rings connected by radial members. The outer ring is coupled to cooling element 820, while the inner ring may be coupled to cooling element 810. Similarly, elastic device 880B includes an inner ring and outer ring segments coupled to the inner ring by radial members. The inner ring is coupled to cooling element 810, while the outer ring segments are coupled to cooling element 820.

Cooling system 800 may share the benefits of cooling system 100, 300, 400, 500, 600 and/or 700. Cooling system 800 may more efficiently dissipate heat from heat-generating structure 802 for the reasons discussed above. Because piezoelectric cooling elements 810 and/or 820 may be actuated to vibrate at ultrasonic frequencies and/or at or near resonance, piezoelectric cooling system 800 may be quieter and consume less power. Because vents 812 and 822 remain physically open, cooling elements 810 and/or 820 may not contact each other (or orifice plate 830) during use. Use of elastic device 880 allows the out-of-phase resonant vibration to be significantly more stable. Thus, resonance of cooling elements 810 and/or 820 may more easily be maintained. Use of landing 814 and/or plug 824 may further increase the resistance to flow in the expulsion arrangement. The benefits of improved, quiet cooling may be achieved with limited additional power. Consequently, performance of devices incorporating cooling system 800 may be improved.

Figure 9:
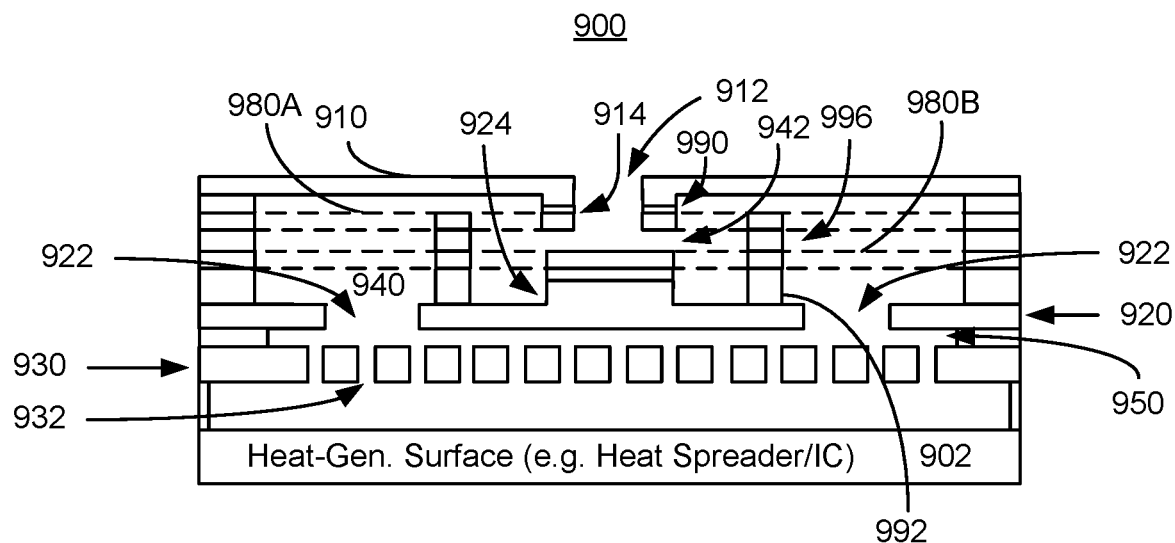
FIG. 9 is a diagram depicting another exemplary embodiment of an active cooling system usable with a structure.

FIG. 9 is a diagram depicting an exemplary embodiment of active cooling system 900 usable with a heat-generating structure 902 and elastic structures usable in such a cooling system. For clarity, only certain components are shown and FIG. 9 is not to scale. Cooling system 900 is used in connection with a heat-generating structure 902. Cooling system 900 and heat-generating structure 902 are analogous to cooling system(s) 100, 300, 400, 500, 600, 700 and/or 800 and heat-generating structure(s) 102, 302, 402, 502, 602, 702 and/or 802, respectively. Thus, cooling system 900 includes piezoelectric cooling elements 910 and 920, passive vent 912, active vent 922, landing 914, plug 924, orifice plate 930 having orifices 932 therein, top chamber 940 having gap 942 and bottom chamber 950. Although not shown, chimneys and ducting may also be included. Cooling elements 910 and/or 920 are actuated to vibrate as described above. Consequently, suction and expulsion arrangements analogous to those described above are also provided. Piezoelectric cooling system 900 may be a MEMS device and thus may have dimensions analogous to those described above.

FIG. 9 depicts cooling system 900 in a neutral configuration. Cooling elements 910 and/or 920 may be driven to be actuated in a manner analogous to cooling systems 100, 300, 400, 500, 600, 700 and/or 800. Thus, fluid is drawn in through passive vent 912 and flows into top chamber 940 in the suction arrangement. Fluid is expelled out of top chamber 940 through active vents 922 and through orifices 932 in the expulsion arrangement. In some embodiments, the fluid speeds and cooling power described above man be achieved. Fluid flows along heat-generating structure 902 and receives heat from heat-generating structure 902. The fluid flows away from heat-generating structure 802 through optional chimneys (not shown) or via another mechanism.

Also shown in cooling system 900 are elastic devices 980A and 980B. Elastic devices 980A and 980B are analogous to elastic device 880. Elastic device 980A is affixed to cooling element 910 via structures 990 (of which only one is labeled). Elastic device 980B is affixed to cooling element 920 via structure 992 (of which only one is labeled). Elastic devices 980A and 980B are affixed to each other using structures 996 (of which only one is labeled). Structures 990, 992 and 996 may be epoxy, adhesive or some other mechanism for bonding elastic devices 980A and 980B to cooling elements 910 and 920 and to each other. Elastic devices 980A and 980B couple cooling elements 910 and 920, but do not prevent fluid flow through cooling system 900. Thus, portions of each elastic device 980A and 980B that may include apertures are depicted with a dashed line. Elastic devices 980A and/or 980B may have portions analogous to elastic devices 880A and 880B depicted in FIGS. 8B and 8C. Referring back to FIG. 9, elastic devices 980A and 980B are used to link the vibrations of cooling elements 910 and 920. Because of the present of elastic devices 980A and 980B, small variations in the vibrations of cooling element(s) 910 and/or 920 may not make substantially one hundred and eighty degree out-of-phase resonant vibration unstable. Thus, elastic devices 980A and 980B may stabilize the frequency mode between cooling element 910 and 920. Consequently, cooling elements 910 and 920 may be more easily controlled to remain both at frequencies of vibration near resonance and out-of-phase. Thus, efficiency of cooling system 900 in driving fluid may be maintained or improved.

Cooling system 900 may share the benefits of cooling system 100, 300, 400, 500, 600, 700 and/or 800. Cooling system 900 may more efficiently dissipate heat from heat-generating structure 902 for the reasons discussed above. Cooling system 900 may be quieter and consume less power. Because vents 912 and 922 are closed using virtual valves (e.g. remain physically open), resonance is more readily maintained. Elastic devices 980A and 980B allow the out-of-phase resonant vibration to be significantly more stable. Use of landing 914 and/or plug 924 may allow for further tailoring of the flow resistances of the virtual valves. The benefits of improved, quiet cooling may be achieved with limited additional power. Consequently, performance of devices incorporating cooling system 900 may be improved.

Figure 10A:
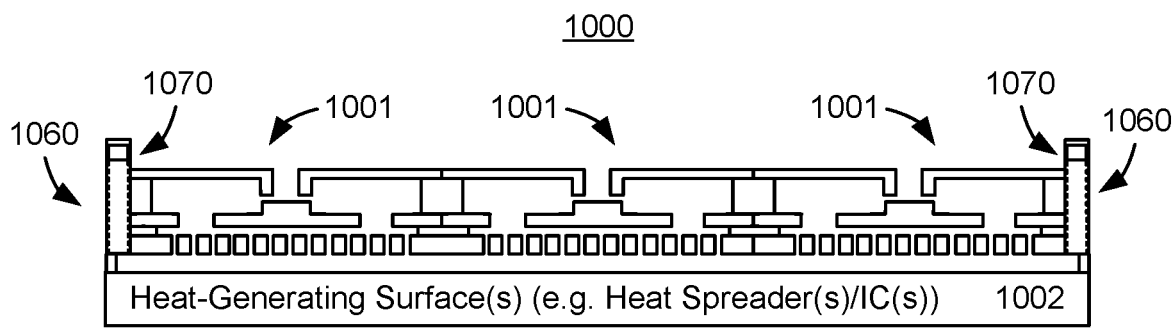
FIGS. 10A-10B are diagrams depicting another exemplary embodiment of an active cooling system usable with a structure.
Figure 10B:
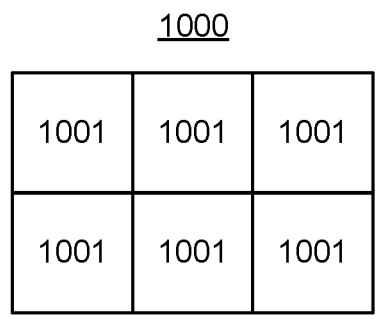

FIGS. 10A-10B depict an array 1000 of cooling systems 1001 used to cool heat-generating structure 1002. FIG. 10A is a side view of array 1000, while FIG. 10B is a plan view of array 1000. Cooling system 1001 may be analogous to one or more of cooling systems 100, 300, 400, 500, 600, 700, 800 and/or 900. Each cooling system 1001 may be considered a cell in array 1000. Heat-generating structure 1002 may be analogous to one or more of and heat-generating structure(s) 102, 302, 402, 502, 602, 702, 802 and/or 902. For clarity, the components of each cell 1001 are not labeled. Further, some components that may be included in cells 1001 are not shown. For example, cell(s) 1001 may include elastic devices analogous to elastic devices 880, 980A and/or 980B. Piezoelectric cells 1001 may be a MEMS device and thus may have dimensions analogous to those described above. Although shown as identical, cells 1001 may differ. Also shown at edges of the array 1000 are chimneys 1060 and ducting 1070 for directing flow of heated fluid. Thus, chimneys 1060 and/or ducting 1070 can, but need not be present at the edges of each cooling system 1001. In other embodiments, chimneys 1060 and/or ducting 1070 may be removed. Although a rectangular array with aligned cells 1001 are shown, in other embodiments, the array need not be rectangular and cells 1001 need not be aligned. Further, in some embodiments, not all cells 1001 need be activated together. For example, in some embodiments, cells 1001 may be individually driven. Thus, cooling systems described herein may be combined. Further, although various features are described for various embodiments, the features may be combined in manners not explicitly described herein.

Figure 11:
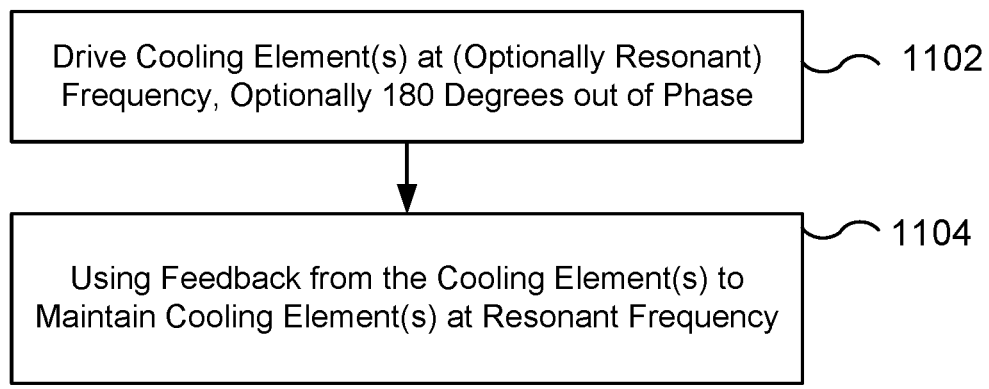
FIG. 11 is a flow chart depicting an exemplary embodiment of a method for driving cooling elements in an embodiment of an active cooling system.

FIG. 11 is a flow chart depicting an exemplary embodiment of method 1100 for operating a cooling system. Method 1100 may include steps that are not depicted for simplicity. Method 1100 is described in the context of piezoelectric cooling system 100. However, method 1100 may be used with other cooling systems including but not limited to systems and cells described herein. Method 1100 is also described in the context of driving a One or more of the piezoelectric cooling element(s) in a cooling system is actuated to vibrate, at 1102. At 1102, an electrical signal having the desired frequency is used to drive the cooling element(s). In some embodiments, the cooling elements are driven at or near resonance at 1102. The driving frequency may be 15 kHz or higher. If multiple piezoelectric cooling elements are driven at 1102, the cooling elements may be driven out-of-phase. In some embodiments, the cooling elements are driven substantially at one hundred and eighty degrees out of phase.

Feedback from the piezoelectric cooling element(s) is used to adjust the driving current, at 1104. In some embodiments, the adjustment is used to maintain the frequency at or near the resonant frequency/frequencies of the cooling element(s). Resonant frequency of a particular cooling element may drift, for example due to changes in temperature. Adjustments made at 1104 allow the drift in resonant frequency to be accounted for.

For example, piezoelectric cooling elements 110 and 120 may be driven at their resonant frequency/frequencies, at 1102. Although the resonant frequencies of cooling elements 110 and 120 may be selected to be similar, there may be small differences in the resonant frequencies. Thus, cooling elements 110 and 120 may not be driven at identical frequencies in some embodiments. Further, as shown in FIGS. 1B-1C, cooling elements 110 and 120 may be driven at one hundred and eighty degrees out-of-phase.

At 1104, feedback is used to maintain piezoelectric cooling elements 110 and 120 at resonance and, in some embodiments, one hundred and eighty degrees out of phase. Thus, the efficiency of cooling elements 110 and 120 in driving fluid flow through cooling system 100 and onto heat-generating structure 102 may be maintained. In some embodiments, 1104 includes sampling the current through piezoelectric cooling elements and adjusting the current to maintain resonance and low input power.

Consequently, piezoelectric cooling elements, such as elements 110 and 120, may operate as described above. Method 1100 thus provides for use of piezoelectric cooling systems described herein. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An active cooling system, comprising:
a vent for the active cooling system;
a cooling element in communication with a fluid, the cooling element being actuated to vibrate to drive the fluid from a first side of the cooling element to a second side of the cooling element at a region offset from the vent, the cooling element driving the fluid toward a heat-generating structure and to alternately open and close at least one virtual valve corresponding to the vent, the at least one virtual valve being open for a low flow resistance and a portion of the cooling element being distal from the vent, the at least one virtual valve being closed for a high flow resistance and the portion of the cooling element being proximate to the vent, the vent remaining physically open when the at least one virtual valve is closed, the cooling element being a single cooling element corresponding to the vent; and
an orifice plate having a plurality of orifices therein, the cooling element being actuated to vibrate to drive the fluid through the plurality of orifices.

2. The active cooling system of claim 1, wherein the cooling element is a piezoelectric micro-electrical mechanical system (MEMS) cooling element.

3. The active cooling system of claim 1, further comprising:
a top plate having the vent therein.

4. The active cooling system of claim 1, wherein the vent and the cooling element are configured such that a ratio of the high flow resistance to the low flow resistance is at least three and not more than ten.

5. An active cooling system comprising:
at least one cooling element having a vent therein and being in communication with a fluid, the at least one cooling element being actuated to vibrate to drive the fluid toward a heat-generating structure and to alternately open and close at least one virtual valve corresponding to the vent, the at least one virtual valve being open for a low flow resistance and closed for a high flow resistance, the vent remaining physically open for the virtual valve being closed;
wherein the at least one cooling element consists of a first cooling element having the vent therein and a second cooling element, wherein the vent is a passive vent, the first cooling element and the second cooling element being in communication with the fluid, the second cooling element being between the first cooling element and the heat-generating structure, the second cooling element having an active vent therein, the at least one virtual valve including a passive virtual valve corresponding to the passive vent and an active virtual valve corresponding to the active vent, the passive virtual valve being open in a suction arrangement and closed in an expulsion arrangement, the active virtual valve being closed in the suction arrangement and open in the expulsion arrangement, the first cooling element and the second cooling element being driven to undergo vibrational motion to provide the suction arrangement and the expulsion arrangement such that the fluid is directed toward the heat-generating structure and such that the active vent and the passive vent remaining physically open throughout the vibrational motion, the vibrational motion being out-of-phase vibrational motion for the first cooling element and the second cooling element such that the passive vent of the first cooling element is distal from the second cooling element in the suction arrangement and proximate to the second cooling element in the expulsion arrangement, the passive vent being offset from the active vent.

6. The active cooling system of claim 5, wherein the first and second cooling elements are configured such that in the expulsion arrangement the passive vent has a passive expulsion flow resistance and the active vent has an active expulsion flow resistance, the first and second cooling elements being configured such that in the suction arrangement the passive vent has a passive suction flow resistance and the active vent has an active suction flow resistance, the passive expulsion flow resistance being greater than the active expulsion flow resistance and the passive suction flow resistance being less than the active suction flow resistance.

7. The active cooling system of claim 6, wherein the passive expulsion flow resistance divided by the passive suction flow resistance is at least three and not more than ten and wherein the active suction flow resistance divided by the active expulsion flow resistance is at least three and not more than ten.

8. The active cooling system of claim 5, further comprising:
an orifice plate having at least one orifice therein, the orifice plate being disposed between the second cooling element and the heat-generating structure, each of the at least one orifice having an axis oriented at an angle from a normal to a surface of the heat-generating structure, the angle being selected from substantially zero degrees and a nonzero acute angle.

9. The active cooling system of claim 5, wherein the first cooling element and the second cooling element are separated by a gap, the vibrational motion being such that the gap has a first width of not more than ten micrometers in the expulsion arrangement and the gap has a second width of not less than twenty micrometers and not more than thirty micrometers in the suction arrangement.

10. The active cooling system of claim 5, wherein the first cooling element and the second cooling element are configured to direct the fluid toward the heat-generating structure at a speed of at least thirty meters per second and up to seventy-five meters per second.

11. The active cooling system of claim 5, wherein the vibrational motion has a frequency of at least 15 kHz and corresponding to a resonance of at least one of the first cooling element and the second cooling element.

12. The active cooling system of claim 5, wherein at least one of the first cooling element and the second cooling element has a resonance frequency and a frequency of the vibrational motion is substantially at the resonance frequency.

13. The active cooling system of claim 5, further comprising:
an elastic device coupling the first cooling element and the second cooling element.

14. An active cooling system comprising:
at least one cooling element having a vent therein and being in communication with a fluid, the at least one cooling element being actuated to vibrate to drive the fluid toward a heat-generating structure and to alternately open and close at least one virtual valve corresponding to the vent, the virtual valve being open for a low flow resistance and closed for a high flow resistance, the vent remaining physically open for the virtual valve being closed;
wherein the at least one cooling element includes a first cooling element and a second cooling element, the vent being a passive vent, the second cooling element being between the first cooling element and the heat-generating structure, the second cooling element having an active vent therein, the at least one virtual valve including a passive virtual valve corresponding to the passive vent and an active virtual valve corresponding to the active vent, the passive virtual valve being open in a suction arrangement and closed in an expulsion arrangement, the active virtual valve being closed in the suction arrangement and open in the expulsion arrangement, the passive vent being distal from the second cooling element in the suction arrangement, the passive vent being proximate to the second cooling element in the expulsion arrangement, at least one of the first cooling element and the second cooling element using vibrational motion to provide the suction arrangement and the expulsion arrangement such that the fluid is directed toward the heat-generating structure and such that the active vent and the passive vent remaining physically open throughout the vibrational motion; and
wherein the first cooling element has a landing adjacent to the passive vent and wherein the second cooling element includes a plug opposite to the landing of the first cooling element.

15. The active cooling system of claim 14, wherein the plug includes a plug surface facing the passive vent, and wherein at least one of the plug surface or a landing surface of the landing forms a tortuous path for the fluid.

16. An active piezoelectric cooling system comprising:
a plurality of piezoelectric cooling cells, each of the plurality of piezoelectric cooling cells including a vent, a cooling element, and an orifice plate including a plurality of orifices therein, the cooling element being in communication with a fluid, the cooling element being actuated to vibrate to drive the fluid from a first side of the cooling element to a second side of the cooling element at a region offset from the vent, the cooling element driving the fluid toward a heat-generating structure and to alternately open and close at least one virtual valve corresponding to the vent, the at least one virtual valve being open for a low flow resistance and a portion of the cooling element being distal from the vent, the virtual valve being closed for a high flow resistance and the portion of the cooling element being proximate to the vent, the vent remaining physically open for the at least one virtual valve being closed, the cooling element being a single piezoelectric cooling element corresponding to the vent and driving the fluid through the plurality of orifices.

17. An active piezoelectric cooling system comprising:

a plurality of piezoelectric cooling cells, each of the plurality of piezoelectric cooling cells including at least one cooling element having a vent therein and being in communication with a fluid, the at least one cooling element being actuated to vibrate to drive the fluid toward a heat-generating structure and to alternately open and close at least one virtual valve corresponding to the vent, the at least one virtual valve being open for a low flow resistance and closed for a high flow resistance, the vent remaining physically open for the at least one virtual valve being closed, the at least one cooling element being at least one piezoelectric cooling element;

wherein the at least one cooling element includes a first cooling element having the vent therein and a second cooling element, wherein the vent is a passive vent therein, the first cooling element and the second cooling element being in communication with the fluid, the second cooling element being between the first cooling element and the heat-generating structure, the second cooling element having an active vent therein, the at least one virtual valve including a passive virtual valve corresponding to the passive vent and an active virtual valve corresponding to the active vent, the passive virtual valve being open in a suction arrangement and closed in an expulsion arrangement, the active virtual valve being closed in the suction arrangement and open in the expulsion arrangement, the first cooling element and the second cooling element being driven to undergo vibrational motion to provide the suction arrangement and the expulsion arrangement such that the fluid is directed toward the heat-generating structure and such that the active vent and the passive vent remaining physically open throughout the vibrational motion, the vibrational motion being out-of-phase vibrational motion for the first cooling element and the second cooling element such that the passive vent is distal from the second cooling element in the suction arrangement and proximate to the second cooling element in the expulsion arrangement, the passive vent being offset from the active vent.

18. The active piezoelectric cooling system of claim 17, each of the plurality of piezoelectric cooling cells further comprising:

an elastic device coupling the first cooling element and the second cooling element.

19. A method of cooling a heat-generating structure, comprising:

driving a cooling element of an active cooling system to induce vibration, the active cooling system including a vent, the cooling element, and an orifice plate having a plurality of orifices therein, the cooling element being in communication with a fluid, the cooling element driving the fluid from a first side of the cooling element to a second side of the cooling element at a region offset from the vent, the cooling element driving the fluid toward the heat-generating structure and alternately opening and closing at least one virtual valve corresponding to the vent, the virtual valve being open for a low flow resistance and a portion of the cooling element being distal from the vent, the virtual valve being closed for a high flow resistance and the portion of the cooling element being proximate to the vent, the vent remaining physically open when the at least one virtual valve is closed, the cooling element being a single cooling element corresponding to the vent.

20. The method of claim 19, wherein the driving the cooling element induces vibrational motion of the cooling element at a frequency, the frequency is substantially at a resonance frequency of the cooling element.

* * * * *